US012249389B2

(12) United States Patent
Shimizu et al.

(10) Patent No.: US 12,249,389 B2
(45) Date of Patent: Mar. 11, 2025

(54) MEMORY SYSTEM AND METHOD

(71) Applicant: KIOXIA CORPORATION, Tokyo (JP)

(72) Inventors: Motoki Shimizu, Yokohama Kanagawa (JP); Kenji Sakurada, Yamato Kanagawa (JP); Naoto Kumano, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 187 days.

(21) Appl. No.: 17/896,887

(22) Filed: Aug. 26, 2022

(65) Prior Publication Data

US 2023/0298685 A1 Sep. 21, 2023

(30) Foreign Application Priority Data

Mar. 18, 2022 (JP) .................. 2022-043995

(51) Int. Cl.
*G11C 29/52* (2006.01)
*G11C 8/08* (2006.01)
*G11C 29/02* (2006.01)
*H03M 13/11* (2006.01)

(52) U.S. Cl.
CPC ............... *G11C 29/52* (2013.01); *G11C 8/08* (2013.01); *G11C 29/021* (2013.01); *H03M 13/1125* (2013.01)

(58) Field of Classification Search
CPC ..................................................... G11C 8/08
See application file for complete search history.

(56) References Cited

U.S. PATENT DOCUMENTS

| 9,396,792 | B2 | 7/2016 | Wu et al. | |
|---|---|---|---|---|
| 10,276,233 | B1* | 4/2019 | Danjean | G11C 11/5642 |
| 10,554,228 | B1* | 2/2020 | Kim | H03M 13/3723 |
| 10,565,053 | B1* | 2/2020 | Hsiao | H03M 13/458 |
| 10,997,017 | B2 | 5/2021 | Cai et al. | |
| 11,283,468 | B1* | 3/2022 | Wu | G06F 11/1012 |
| 2013/0077400 | A1* | 3/2013 | Sakurada | G11C 16/06 365/185.03 |
| 2014/0223263 | A1 | 8/2014 | Sakurada et al. | |
| 2015/0149871 | A1* | 5/2015 | Chen | G11C 11/5642 714/773 |
| 2015/0242268 | A1* | 8/2015 | Wu | G06F 11/1072 714/773 |
| 2016/0093396 | A1* | 3/2016 | Alhussien | G11C 29/42 365/185.21 |
| 2016/0266969 | A1* | 9/2016 | Jeon | H03M 13/1111 |

(Continued)

FOREIGN PATENT DOCUMENTS

JP 2019125910 A 7/2019

*Primary Examiner* — Douglas King
(74) *Attorney, Agent, or Firm* — Kim & Stewart LLP

(57) ABSTRACT

A memory system includes a semiconductor memory device including a plurality of memory cells each configured to store data in a non-volatile manner according to a threshold voltage thereof and connected to a word line, and a controller configured to perform an error correction based on hard bit data and soft bit data read from the plurality of memory cells, generate a first table based on corrected data, determine a voltage difference between a first voltage and a second voltage, the first voltage being a voltage applied to the word line when the data being corrected is read, and correct the first table based on the voltage difference.

20 Claims, 30 Drawing Sheets

(56) References Cited

U.S. PATENT DOCUMENTS

2018/0074894 A1* 3/2018 Sakurada ............... G11C 16/10
2019/0087264 A1* 3/2019 Tokutomi .......... H03M 13/6505
2019/0220348 A1* 7/2019 Kokubun ............... G11C 29/52
2021/0211142 A1* 7/2021 Hyodo .............. H03M 13/6337

* cited by examiner

FIG. 8

| index | 0 | 1 | 2 | 3 | 4 | 5 | 6 | 7 |
|---|---|---|---|---|---|---|---|---|
| LLR | −9 | −5 | −3 | −1 | +1 | +3 | +5 | +9 |

FIG. 9

| index | 0 | 1 | 2 | 3 | 4 | 5 | 6 | 7 |
|---|---|---|---|---|---|---|---|---|
| DLECNT 1 | num1[0] | num1[1] | num1[2] | num1[3] | num1[4] | num1[5] | num1[6] | num1[7] |
| DLECNT 0 | num0[0] | num0[1] | num0[2] | num0[3] | num0[4] | num0[5] | num0[6] | num0[7] |

FIG. 11A

DLE1 TABLE (AFTER GENERATION)

| index | 0 | 1 | 2 | 3 | 4 | 5 | 6 | 7 |
|---|---|---|---|---|---|---|---|---|
| LLR | −5 | −3 | −1 | +1 | +3 | +5 | +9 | +9 |

SHIFT LLR OF EACH OF INDEXES 0 TO 5 IN RIGHT DIRECTION BY 1

DLE1 TABLE (AFTER SHIFT)

| index | 0 | 1 | 2 | 3 | 4 | 5 | 6 | 7 |
|---|---|---|---|---|---|---|---|---|
| LLR |  | −5 | −3 | −1 | +1 | +3 | +5 |  |

CALCULATE INTEGRATED VALUE BASED ON DLECNT OF EACH OF INDEXES 6 AND 7, AND SET INTEGRATED VALUE AS LLR OF INDEX 7

DLE1 TABLE (AFTER INTEGRATION)

| index | 0 | 1 | 2 | 3 | 4 | 5 | 6 | 7 |
|---|---|---|---|---|---|---|---|---|
| LLR |  | −5 | −3 | −1 | +1 | +3 | +5 | (+9) |

−9

SET VALUE ACQUIRED BY INVERTING SIGN OF INTEGRATED VALUE AS LLR OF INDEX 0

DLE1 TABLE (CORRECTION COMPLETED)

| index | 0 | 1 | 2 | 3 | 4 | 5 | 6 | 7 |
|---|---|---|---|---|---|---|---|---|
| LLR | −9 | −5 | −3 | −1 | +1 | +3 | +5 | +9 |

FIG. 11B

DLE1 TABLE (AFTER GENERATION)

| index | 0 | 1 | 2 | 3 | 4 | 5 | 6 | 7 |
|---|---|---|---|---|---|---|---|---|
| LLR | −3 | −1 | +1 | +3 | +5 | +9 | +9 | +9 |

SHIFT LLR OF EACH OF INDEXES 0 TO 4 IN RIGHT DIRECTION BY 2

DLE1 TABLE (AFTER SHIFT)

| index | 0 | 1 | 2 | 3 | 4 | 5 | 6 | 7 |
|---|---|---|---|---|---|---|---|---|
| LLR |  |  | −3 | −1 | +1 | +3 | +5 |  |

CALCULATE INTEGRATED VALUE BASED ON DLECNT OF EACH OF INDEXES 5 TO 7, AND SET INTEGRATED VALUE AS LLR OF INDEX 7

DLE1 TABLE (AFTER INTEGRATION)

| index | 0 | 1 | 2 | 3 | 4 | 5 | 6 | 7 |
|---|---|---|---|---|---|---|---|---|
| LLR |  |  | −3 | −1 | +1 | +3 | +5 | (+9) |

−9

SET VALUE ACQUIRED BY INVERTING SIGN OF INTEGRATED VALUE AS LLR OF INDEX 0

DLE1 TABLE

| index | 0 | 1 | 2 | 3 | 4 | 5 | 6 | 7 |
|---|---|---|---|---|---|---|---|---|
| LLR | −9 |  | −3 | −1 | +1 | +3 | (+5) | +9 |

−5

SET VALUE ACQUIRED BY INVERTING SIGN OF LLR OF INDEX 6 AS LLR OF INDEX 1

DLE1 TABLE (CORRECTION COMPLETED)

| index | 0 | 1 | 2 | 3 | 4 | 5 | 6 | 7 |
|---|---|---|---|---|---|---|---|---|
| LLR | −9 | −5 | −3 | −1 | +1 | +3 | +5 | +9 |

FIG. 11C

DLE1 TABLE (AFTER GENERATION)

| index | 0  | 1  | 2  | 3  | 4  | 5  | 6  | 7  |
|-------|----|----|----|----|----|----|----|----|
| LLR   | −9 | −9 | −5 | −3 | −1 | +1 | +3 | +5 |

SHIFT LLR OF EACH OF INDEXES 2 to 7 IN LEFT DIRECTION BY 1

DLE1 TABLE (AFTER SHIFT)

| index | 0 | 1 | 2  | 3  | 4  | 5  | 6  | 7 |
|-------|---|---|----|----|----|----|----|---|
| LLR   |   |   | −5 | −3 | −1 | +1 | +3 | +5 |

CALCULATE INTEGRATED VALUE BASED ON DLECNT OF EACH OF INDEXES 0 AND 1, AND SET INTEGRATED VALUE AS LLR OF INDEX 0

DLE1 TABLE (AFTER INTEGRATION)

| index | 0    | 1  | 2  | 3  | 4  | 5  | 6  | 7 |
|-------|------|----|----|----|----|----|----|---|
| LLR   | (−9) | −5 | −3 | −1 | +1 | +3 | +5 |   |

+9

SET VALUE ACQUIRED BY INVERTING SIGN OF INTEGRATED VALUE AS LLR OF INDEX 7

DLE1 TABLE (CORRECTION COMPLETED)

| index | 0  | 1  | 2  | 3  | 4  | 5  | 6  | 7  |
|-------|----|----|----|----|----|----|----|----|
| LLR   | −9 | −5 | −3 | −1 | +1 | +3 | +5 | +9 |

FIG. 13B

DLE1 TABLE (TABLE D1A) GENERATED BY SB CORRECTION OF FIRST PAGE

| index | 0  | 1  | 2  | 3  | 4  | 5  | 6  | 7  |
|-------|----|----|----|----|----|----|----|----|
| LLR   | −5 | −3 | −1 | +1 | +3 | +5 | +9 | +9 |

SIGN OF LLR IS INVERTED    CORRECT TABLE D1A

DLE1 TABLE (TABLE D1B) CORRECTED BY SB CORRECTION OF FIRST PAGE

| index | 0  | 1  | 2  | 3  | 4  | 5  | 6  | 7  |
|-------|----|----|----|----|----|----|----|----|
| LLR   | −9 | −5 | −3 | −1 | +1 | +3 | +5 | +9 |

APPLY TABLE D1B TO SECOND PAGE    SIGN OF LLR IS INVERTED

THRESHOLD VOLTAGE DISTRIBUTION OF SECOND

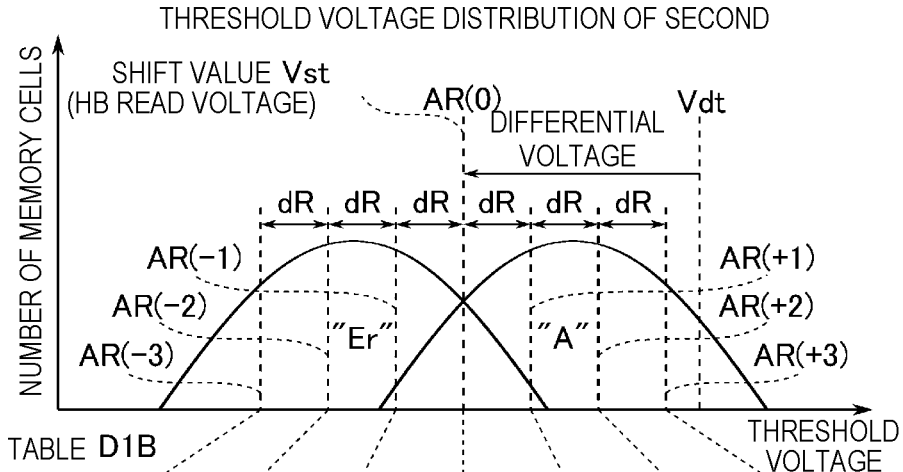

| index | 0  | 1  | 2  | 3  | 4  | 5  | 6  | 7  |
|-------|----|----|----|----|----|----|----|----|
| LLR   | −9 | −5 | −3 | −1 | +1 | +3 | +5 | +9 |

LOCATION WHERE SIGN OF LLR IS INVERTED    LOCATION OF INTERSECTION OF THRESHOLD VOLTAGE DISTRIBUTIONS

FIG. 17

DLE1 TABLE (AFTER GENERATION)

| index | 0  | 1  | 2  | 3  | 4  | 5  | 6  | 7  |
|-------|----|----|----|----|----|----|----|----|
| LLR   | -5 | -3 | -1 | +1 | +3 | +5 | +9 | +9 |

SHIFT LLR OF EACH OF INDEXES 0 TO 5 IN RIGHT DIRECTION BY 1

⇩

DLE1 TABLE (AFTER SHIFT)

| index | 0 | 1  | 2  | 3  | 4  | 5  | 6  | 7 |
|-------|---|----|----|----|----|----|----|---|
| LLR   |   | -5 | -3 | -1 | +1 | +3 | +5 |   |

CALCULATE INTEGRATED VALUE BASED ON DLECNT OF EACH OF INDEXES 6 AND 7, AND SET INTEGRATED VALUE AS LLR OF INDEX 7

⇩

DLE1 TABLE (AFTER INTEGRATION (FIRST CORRECTION COMPLETED))

| index | 0 | 1  | 2  | 3  | 4  | 5  | 6  | 7  |
|-------|---|----|----|----|----|----|----|----|
| LLR   |   | -5 | -3 | -1 | +1 | +3 | +5 | +9 |

} FIRST CORRECTION PROCESSING

DLE1 TABLE (AFTER FIRST CORRECTION COMPLETED)

| index | 0 | 1  | 2  | 3  | 4  | 5  | 6  | 7  |
|-------|---|----|----|----|----|----|----|----|
| LLR   |   | -5 | -3 | -1 | +1 | +3 | +5 | +9 |

DLE2 TABLE

| index | 0  | 1  | 2  | 3  | 4  | 5  | 6  | 7  |
|-------|----|----|----|----|----|----|----|----|
| LLR   | -9 | -5 | -3 | -1 | +1 | +3 | +5 | +9 |

SET LLR OF INDEX 0 OF DLE2 TABLE AS LLR OF INDEX 0 OF DLE1 TABLE

⇩

DLE1 TABLE (SECOND CORRECTION COMPLETED)

| index | 0  | 1  | 2  | 3  | 4  | 5  | 6  | 7  |
|-------|----|----|----|----|----|----|----|----|
| LLR   | -9 | -5 | -3 | -1 | +1 | +3 | +5 | +9 |

} SECOND CORRECTION PROCESSING

FIG. 22

DLE1 TABLE (AFTER INTEGRATION)

| index | 0 | 1 | 2 | 3 | 4 | 5 | 6 | 7 |
|---|---|---|---|---|---|---|---|---|
| LLR |  | −5 | −3 | −1 | +1 | +3 | +5 | +9 |

EQUATION (3)
$LLR1 = LLR8 \times \{-1 \times (LLR2+LLR3+LLR4)/(LLR5+LLR6+LLR7)\}$
SET LLR1(= −9) CALCULATED BY EQUATION (3) AS LLR OF INDEX 0

⇩

DLE1 TABLE (CORRECTION COMPLETED)

| index | 0 | 1 | 2 | 3 | 4 | 5 | 6 | 7 |
|---|---|---|---|---|---|---|---|---|
| LLR | −9 | −5 | −3 | −1 | +1 | +3 | +5 | +9 | ns
MEMORY SYSTEM AND METHOD

CROSS-REFERENCE TO RELATED APPLICATION(S)

This application is based upon and claims the benefit of priority from Japanese Patent Application No. 2022-043995, filed Mar. 18, 2022, the entire contents of which are incorporated herein by reference.

FIELD

Embodiments described herein relate generally to a memory system.

BACKGROUND

A memory system including a semiconductor memory device and a memory controller that controls the semiconductor memory device is known. Soft-decision decoding is known as an error correction method when reading data from the semiconductor memory device.

DESCRIPTION OF THE DRAWINGS

FIG. 8 is a conceptual diagram of a log likelihood ratio (LLR) table according to the first embodiment.

FIG. 9 is a table illustrating a channel matrix according to the first embodiment.

FIG. 11A is a diagram illustrating a first example for correction processing of a dynamic LLR estimation (DLE) table according to the first embodiment.

FIG. 11B is a diagram illustrating a second example for the correction processing of the DLE table according to the first embodiment.

FIG. 11C is a diagram illustrating a third example for the correction processing of the DLE table according to the first embodiment.

FIGS. 13A and 13B are diagrams illustrating an effect of the memory system according to the first embodiment.

FIG. 17 is a diagram illustrating a first correction processing and a second correction processing of a DLE table according to the second embodiment.

FIG. 22 is a diagram illustrating correction processing of a DLE table according to a fourth embodiment.

DETAILED DESCRIPTION

Figure 1:
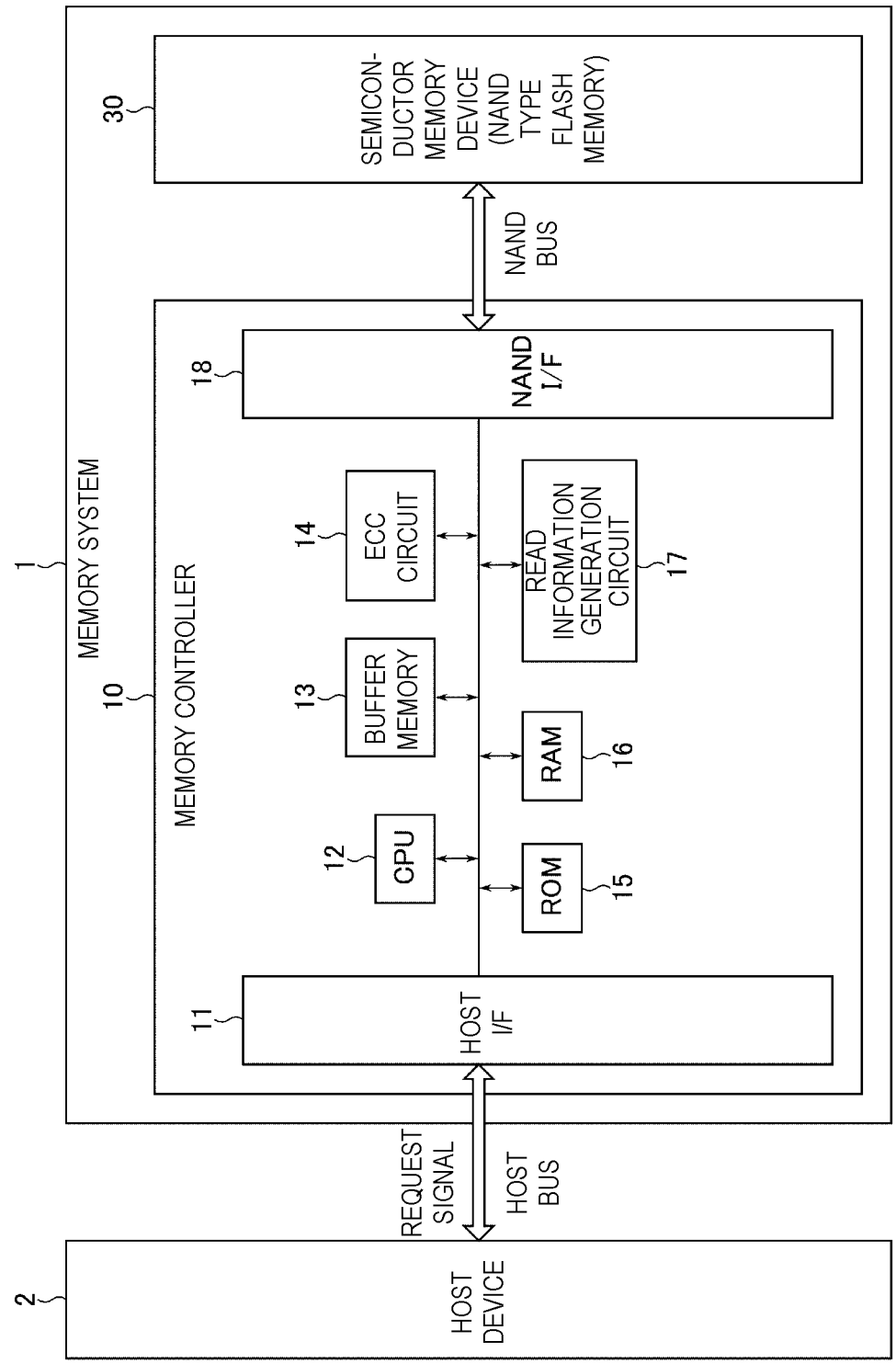
FIG. 1 is a block diagram illustrating an example of an information processing system including a memory system according to a first embodiment.

Embodiments provide a memory system having an enhanced error correction capability.

In general, according to one embodiment, the memory system includes a semiconductor memory device including a plurality of memory cells each configured to store data in a non-volatile manner according to a threshold voltage thereof and connected to a word line, and a controller configured to perform an error correction based on hard bit data and soft bit data read from the plurality of memory cells, generate a first table based on data corrected by the error correction, determine a voltage difference between a first voltage and a second voltage, the first voltage being a voltage applied to the word line when the data being corrected is read, and correct the first table based on the voltage difference.

Hereinafter, embodiments will be described with reference to drawings. In the description, common reference numerals are given to common parts throughout all drawings.

Functional blocks may not be distinguished from each other in the following examples. For example, certain functions may be executed by a functional block different from the illustrated functional block. Further, the illustrated functional block may be divided into further subdivided functional sub-blocks. The embodiment is not limited to the particular functional block that the function is implemented by.

Further, each functional block may be implemented by any one of hardware and computer software, or a combination of both.

[1] First Embodiment

The memory system according to the first embodiment will be described. Hereinafter, as a semiconductor memory device, a memory system including a NAND type flash memory will be described as an example.

[1-1] Configuration

[1-1-1] Configuration of Memory System

A configuration example of the memory system according to the embodiment will be described with reference to FIG. 1. FIG. 1 is a block diagram illustrating an example of an information processing system including the memory system according to the embodiment.

The information processing system includes a memory system 1 and a host device 2.

The memory system 1 is, for example, a solid state drive (SSD), a universal flash storage (UFS) device, a universal serial bus (USB) memory, a multi-media card (MMC), or an (SSD) card. The memory system 1 is connectable to the host device 2. The memory system 1 performs processing based on a request signal received from the host device 2 or a spontaneous (or, internal) processing request.

The host device 2 is, for example, a personal computer, a server system, a mobile device, an in-vehicle device, or a digital camera.

Next, an internal configuration of the memory system 1 will be described.

The memory system 1 includes a memory controller 10 and a semiconductor memory device 30. The semiconductor memory device 30 is a non-volatile memory such as a NAND type flash memory. Hereinafter, the semiconductor memory device 30 is also referred to as the NAND type flash memory 30.

The memory controller 10 is, for example, a system-on-a-chip (SoC). The memory controller 10 is connected to the host device 2 through a host bus. The memory controller 10 receives a request signal from the host device 2 through the host bus. The type of the host bus depends on the type of the memory system 1. When the memory system 1 is an SSD, for example, an interface of a Serial Attached SCSI (SAS), Serial ATA (SATA), or Peripheral Component Interconnect Express (PCI Express® or PCIe) standard is used as the host bus. When the memory system 1 is the UFS device, an interface of an M-PHY standard is used as the host bus. When the memory system 1 is the USB memory, an interface of a USB standard is used as the host bus. When the memory system 1 is the MMC, an interface of an Embedded Multi Media Card (eMMC) standard is used as the host bus. When the memory system 1 is the SD® card, an interface of an SD® standard is used as the host bus.

The memory controller 10 controls the NAND type flash memory 30 through a NAND bus based on the request signal received from the host device 2 or the spontaneous processing request. The NAND bus performs a transmission and reception of a signal according to the NAND interface standard.

The NAND type flash memory 30 includes a plurality of memory cell transistors. Each of the plurality of memory cell transistors stores data in a non-volatile manner according to a threshold voltage thereof. The NAND type flash memory 30 stores the data received from the memory controller 10 in the plurality of memory cell transistors in the non-volatile manner. The NAND type flash memory 30 outputs the data read from the plurality of memory cell transistors to the memory controller 10.

Next, an internal configuration of the memory controller 10 will be described.

The memory controller 10 includes a host interface (I/F) circuit 11, a processor (central processing unit (CPU)) 12, a buffer memory 13, an error checking and correcting (ECC) circuit 14, a read only memory (ROM) 15, a random access memory (RAM) 16, a read information generation circuit 17, and a NAND interface (I/F) circuit 18.

The host interface circuit 11 is in charge of communication between the memory controller 10 and the host device 2. The host interface circuit 11 is connected to the host device 2 through the host bus.

The processor 12 is a control circuit of the memory controller 10. The processor 12 controls the entire operation of the memory controller 10 by executing a program stored in the ROM 15. For example, when the processor 12 receives a write request from the host device 2, the processor 12 controls a write operation based thereon. The same applies to a read operation and an erase operation.

The buffer memory 13 is, for example, a static random access memory (SRAM). The buffer memory 13 temporarily stores write data and read data. The write data is data to be written to the NAND type flash memory 30. The read data is data read from the NAND type flash memory 30.

The ECC circuit 14 is a circuit that performs ECC processing. The ECC processing includes the encoding and decoding of data. The encoding is an operation of generating an error correction code (hereinafter, also referred to as "parity") based on the data received from the host device 2 (and referred to herein as user data) in the write operation. The error correction code is added to the user data. The error correction code (ECC) is added to the user data to after the encoding has completed. Hereinafter, in the ECC circuit 14, a set of data to be decoded is represented as an "ECC frame". The ECC frame includes the user data and the error correction code (ECC). The decoding is an operation of performing an error correction of the user data based on the ECC frame received from the NAND type flash memory 30 in the read operation. The error correction code (ECC) is used to detect and correct an error.

Further, the write operation and the read operation are performed in units of a page to be described below. In the present disclosure, write data and read data having a data length for 1 page are also referred to as "page data". The page data may include a plurality of ECC frames. Also, the data length of the page data and the data length of the ECC frame may be equal to each other.

In the embodiment, the read operation includes a hard bit (HB) read and a soft bit (SB) read.

The HB read is the process of reading data using one type of read voltage (hereinafter, also referred to as a "HB read voltage") corresponding to a boundary of threshold voltage distributions of the memory cell transistor, and acquiring a determination result of determining whether the data stored in the memory cell transistor is "0" or "1". The page data acquired by the HB read is also referred to as "HB data". Each bit of the HB data is referred to as a "hard bit".

The SB read is the process of reading data using a plurality of voltages (hereinafter, also referred to as "SB read voltages") set with the HB read voltage as a reference, and acquiring a calculation result of logically computing a plurality of pieces of read data. The SB read is performed when the error correction by a hard-decision decoding circuit 20 (to be described later) is unsuccessful. The page data acquired by the SB read is also referred to as "SB data". Each bit of the SB data is referred to as a "soft bit".

The ROM 15 is, for example, an Electrically Erasable Programmable Read-Only Memory (EEPROM®). The ROM 15 stores a program such as firmware.

The RAM 16 is, for example, an SRAM. The RAM 16 is used as a work area of the processor 12. The RAM 16 stores firmware and various management information for managing the NAND type flash memory 30. The RAM 16 stores, for example, a log likelihood ratio (LLR) table and a value Vst of a read voltage (hereinafter, also just represented by a "shift value Vst") shifted from a default HB read voltage (which is an initial value of the HB read voltage). Hereinafter, the default HB read voltage will also be referred to as a "default voltage Vdt".

The LLR table is a table in which the read data and the LLR are associated with each other. The LLR is information representing a probability that the data stored in the memory cell transistor is "0" and a probability that the data stored in the memory cell transistor is "1" as a logarithmic ratio. Details of the LLR table and the shift value Vst will be described later. The LLR table is loaded in the RAM 16 from the NAND type flash memory 30, for example, immediately after power is turned on. The shift value Vst is written to the RAM 16, for example, when the shift value Vst is generated. Note that an initial value of the shift value Vst is equal to the default voltage Vdt.

The read information generation circuit 17 is a circuit that performs generation processing of a dynamic LLR estimation (DLE) table (referred to herein as DLE1 table to distinguish from another DLE table, DLE2 table, introduced later) and the shift value Vst as information on the HB read and the SB read. The DLE1 table is a table representing a relationship between a voltage range of threshold voltages of the plurality of memory cell transistor and the LLR, and is generated based on data of which correction is successful in a soft-decision decoding circuit 21 (to be described later). Details of the processing of the read information generation circuit 17, and the DLE1 table will be described later.

The NAND interface circuit 18 is in charge of communication between the memory controller 10 and the NAND type flash memory 30. The NAND interface circuit 18 is connected to the NAND type flash memory 30 through the NAND bus. For example, the NAND interface circuit 18 controls the transmission of data, a command, and an address between the memory controller 10 and the NAND type flash memory 30.

[1-1-2] Configuration of ECC Circuit

Figure 2:
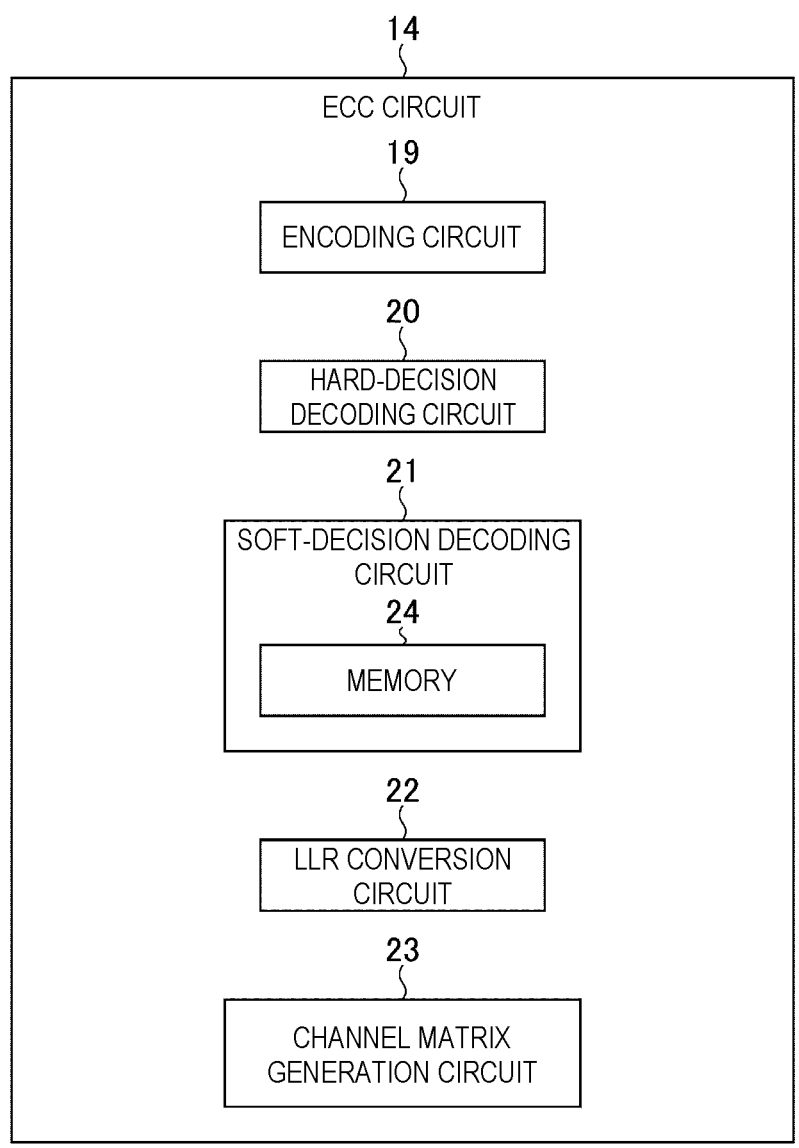
FIG. 2 is a block diagram illustrating an example of a configuration of an error checking and correcting (ECC) circuit in a memory controller provided in the memory system according to the first embodiment.

An internal configuration of the ECC circuit 14 will be described with reference to FIG. 2. FIG. 2 is a block diagram illustrating an example of a configuration of an ECC circuit.

The ECC circuit 14 includes an encoding circuit 19, a hard-decision decoding circuit 20, a soft-decision decoding circuit 21, an LLR conversion circuit 22, and a channel matrix generation circuit 23.

The encoding circuit 19 is a circuit that performs encoding processing. The encoding circuit 19 generates parity, which includes, for example, hard-decision parity and soft-decision parity. An example of the hard-decision parity is a Bose-Chaudhuri-Hocquenghem (BCH) code and a Reed-Solomon (RS) code. An example of the soft-decision parity is a Low-Density Parity-Check (LDPC) code. The encoding circuit 19 adds the parity to the user data.

The hard-decision decoding circuit 20 is a circuit that performs hard-decision decoding. The hard-decision decoding circuit 20 is a circuit that performs the error correction using the hard-decision parity. Specifically, the hard-decision decoding circuit 20 detects an error of the user data using the hard-decision parity per ECC frame with respect to the HB data. When the error is detected, the hard-decision decoding circuit 20 corrects the error of the user data. Hereinafter, the error correction by the hard-decision decoding circuit 20 will also be referred to as an "HB correction".

The soft-decision decoding circuit 21 is a circuit that performs soft-decision decoding. The soft-decision decoding circuit 21 is a circuit that performs the error correction using the LLR and the soft-decision parity. Specifically, the soft-decision decoding circuit 21 performs a repeated calculation based on the probability using the LLR and the soft-decision parity per ECC frame with respect to the HB data and the SB data. The soft-decision decoding circuit 21 corrects an error of the user data based on a result of the repeated calculation. Hereinafter, the error correction by the soft-decision decoding circuit 21 will also be referred to as an "SB correction". The LLR is generated by the LLR conversion circuit 22.

The LLR conversion circuit 22 is a circuit that performs LLR conversion processing. The LLR conversion circuit 22 converts a combination of the hard bit and the soft bit into the LLR per ECC frame using the LLR table.

The channel matrix generation circuit 23 is a circuit that performs generation processing of the channel matrix. The channel matrix generation circuit 23 generates the channel matrix per ECC frame using the combination of the hard bit and the soft bit, and data of which correction is successful in the soft-decision decoding circuit 21. Hereinafter, the data of which correction is successful in the soft-decision decoding circuit 21 will also be referred to as "corrected data". The channel matrix is generated by counting the number of data "0" and the number of data "1" in the corrected data every combination of the hard bit and the soft bit. Details of the channel matrix will be described later.

The soft-decision decoding circuit 21 includes a memory 24. The memory 24 is, for example, an SRAM. The memory 24 stores the HB data and the SB data acquired from the buffer memory 13, the LLR acquired by conversion in the LLR conversion circuit 22, the data corrected in the soft-decision decoding circuit 21, and the DLE1 table generated by the read information generation circuit 17.

Details of the processing of the ECC circuit 14 will be described later.

[1-1-3] Configuration of NAND Type Flash Memory

Figure 3:
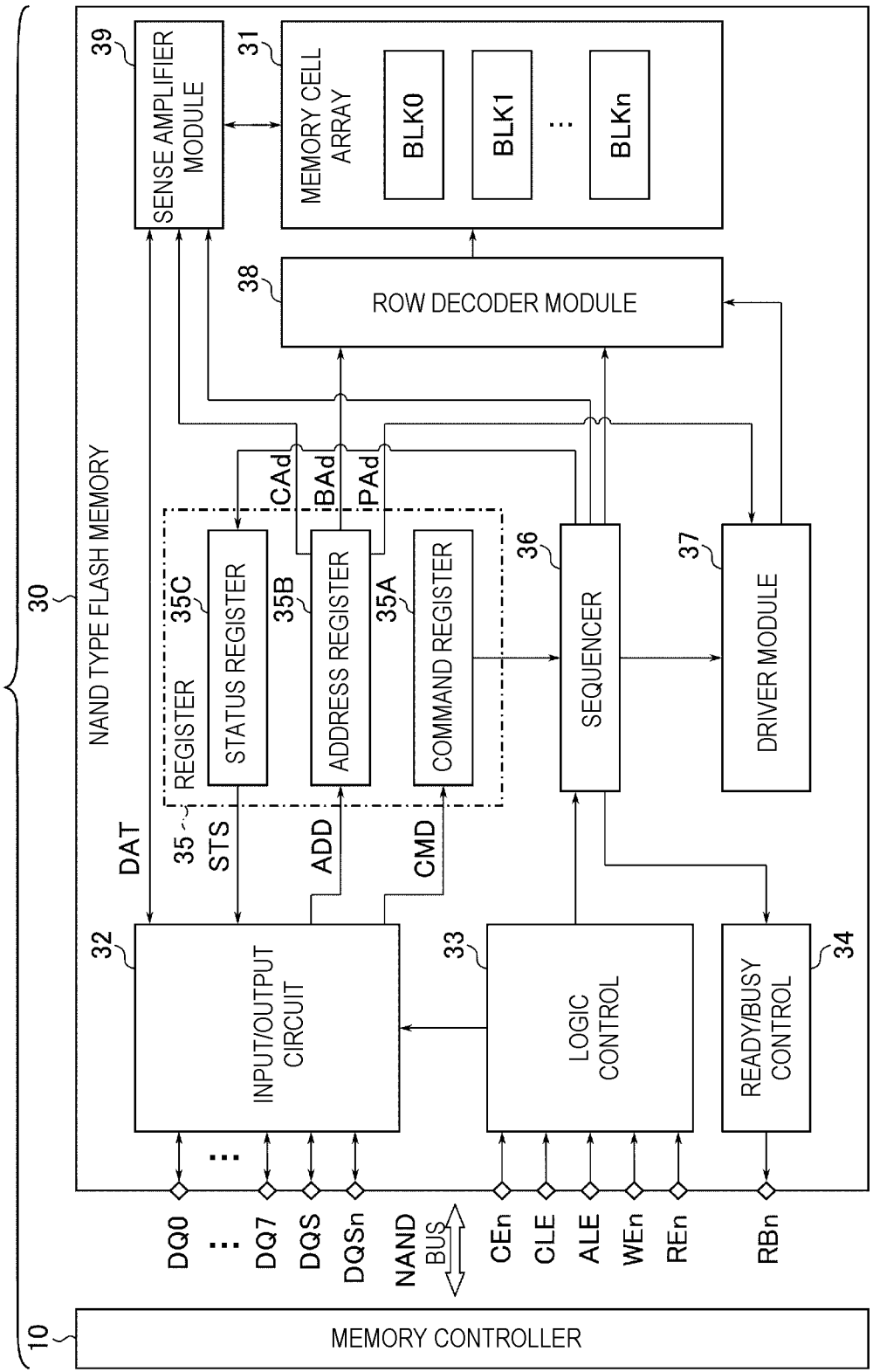
FIG. 3 is a block diagram illustrating an example of a configuration of a semiconductor memory device provided in the memory system according to the first embodiment.

The configuration of the NAND type flash memory 30 will be described with reference to FIG. 3. FIG. 3 is a block diagram illustrating an example of the configuration of the NAND type flash memory 30. The NAND type flash memory 30 includes a memory cell array 31, an input/output circuit 32, a logic control circuit 33, a ready/busy control circuit 34, a register 35, a sequencer 36, a driver module 37, a row decoder module 38, and a sense amplifier module 39.

The memory cell array 31 includes a plurality of blocks BLK0 to BLKn (n is an integer of 1 or more). The block BLK is, for example, a set of a plurality of memory cell transistors in which data is collectively erased. For example, the block BLK is used as a unit of a data erase operation. The block BLK includes a plurality of word lines. The memory cell transistor is capable of storing data in the non-volatile manner. A plurality of bit lines and a plurality of word lines are provided in the memory cell array 31. Each memory cell transistor is associated with, for example, one bit line and one word line. Details of the memory cell array 31 will be described below.

The input/output circuit 32 transmits and receives an input/output signal DQ (e.g., 8-bit signals DQ0 to DQ7), and data strobe signals DQS and DQSn (an inverted signal of the signal DQS) to and from the memory controller 10. The signal DQ contains various data that is transmitted and received between the NAND type flash memory 30 and the memory controller 10. The signal DQ contains, for example, a command CMD, an address ADD, status information STS, and data DAT. The signals DQS and DQSn are signals for controlling transmission and reception timings of the signal DQ. For example, the signals DQS and DQSn are transmitted from the memory controller 10 to the NAND type flash memory 30 jointly with the signal DQ containing the write data in writing the data. The NAND type flash memory 30 receives the signal DQ containing the write data in synchronizing with the signals DQS and DQSn. Further, the signals DQS and DQSn are transmitted from the NAND type flash memory 30 to the memory controller 10 jointly with the signal DQ containing the read data in reading the data. The memory controller 10 receives the signal DQ containing the read data in synchronizing with the signals DQS and DQSn. Further, the input/output circuit 32 may receive the signals DQS and DQSn from the memory controller 10 through the logic control circuit 33.

Further, the input/output circuit 32 transmits the command CMD in the signal DQ to a command register 35A. The input/output circuit 32 transmits the address ADD in the signal DQ to an address register 35B. The input/output circuit 32 receives the status information STS from a status register 35C. The input/output circuit 32 transmits and receives the data DAT in the signal DQ to and from the sense amplifier module 39.

The logic control circuit 33 receives, from the memory controller 10, a chip enable signal CEn, a command latch enable signal CLE, an address latch enable signal ALE, a write enable signal WEn, and a read enable signal REn. The signal CEn is a signal for enabling the NAND type flash memory 30. The signal CLE is a signal indicating that the signal DQ received by the NAND type flash memory 30 is the command CMD. The signal ALE is a signal indicating that the signal DQ received by the NAND type flash memory 30 is the address ADD. The signal WEn is a signal for commanding an input of the signal DQ into the NAND type flash memory 30. The signal REn is a signal for commanding an output of the signal DQ to the NAND type flash memory 30. The NAND type flash memory 30 generates the signals DQS and DQSn based on the signal REn. The NAND type flash memory 30 outputs the signal DQ to the memory controller 10 based on the generated signals DQS and DQSn. The logic control circuit 33 controls the input/output circuit 32 and the sequencer 36 based on the received signal.

The ready/busy control circuit 34 transmits a ready/busy signal RBn to the memory controller 10 based on an operation situation of the sequencer 36. The signal RBn is a signal indicating which state of a ready state and a busy state the NAND type flash memory 30 is in. The signal RBn becomes the "Low" level when the NAND type flash memory 30 is in, for example, the busy state. The ready state is a state in which the NAND type flash memory 30 is capable of receiving a command from the memory controller 10. The busy state is a state in which the NAND type flash memory 30 is incapable of receiving a command from the memory controller 10.

The register 35 includes the command register 35A, the address register 35B, and the status register 35C.

The command register 35A stores the command CMD. The command CMD includes, for example, a command which instructs the sequencer 36 to execute a read operation, a write operation, and an erase operation.

The address register 35B stores the address ADD. The address ADD includes, for example, a block address BAd, a page address PAd, and a column address CAd. The block address BAd, the page address PAd, and the column address CAd are used for selection of, for example, the block BLK, the word line, and the bit line, respectively.

The status register 35C temporarily stores the status information STS in, for example, the read operation, the write operation, and the erase operation. The status information STS is used for notifying the memory controller 10 whether the operation is normally terminated.

The sequencer 36 controls an entire operation of the NAND type flash memory 30. For example, the sequencer 36 controls the ready/busy control circuit 34, the driver module 37, the row decoder module 38, and the sense amplifier module 39 based on the command CMD stored in the command register 35A. For example, the sequencer 36 executes the read operation, the write operation, and the erase operation.

The driver module 37 generates a voltage used in the read operation, the write operation, and the erase operation. The driver module 37 applies the generated voltage to a signal line corresponding to the selected word line based on the page address PAd stored in the address register 35B.

The row decoder module 38 selects one block BLK in the memory cell array 31 based on the block address BAd stored in the address register 35B. The row decoder module 38 transmits the voltage applied to the signal line corresponding to the selected word line corresponding to the selected word line in the selected block BLK.

The sense amplifier module 39 applies, to the bit line, a voltage based on the write data DAT received from the input/output circuit 32 in the write operation. Further, the sense amplifier module 39 determines the data stored in the memory cell transistor based on the voltage of the bit line in the read operation. The sense amplifier module 39 transmits a determination result as the read data DAT to the input/output circuit 32.

[1-1-4] Circuit Configuration of Memory Cell Array

Figure 4:
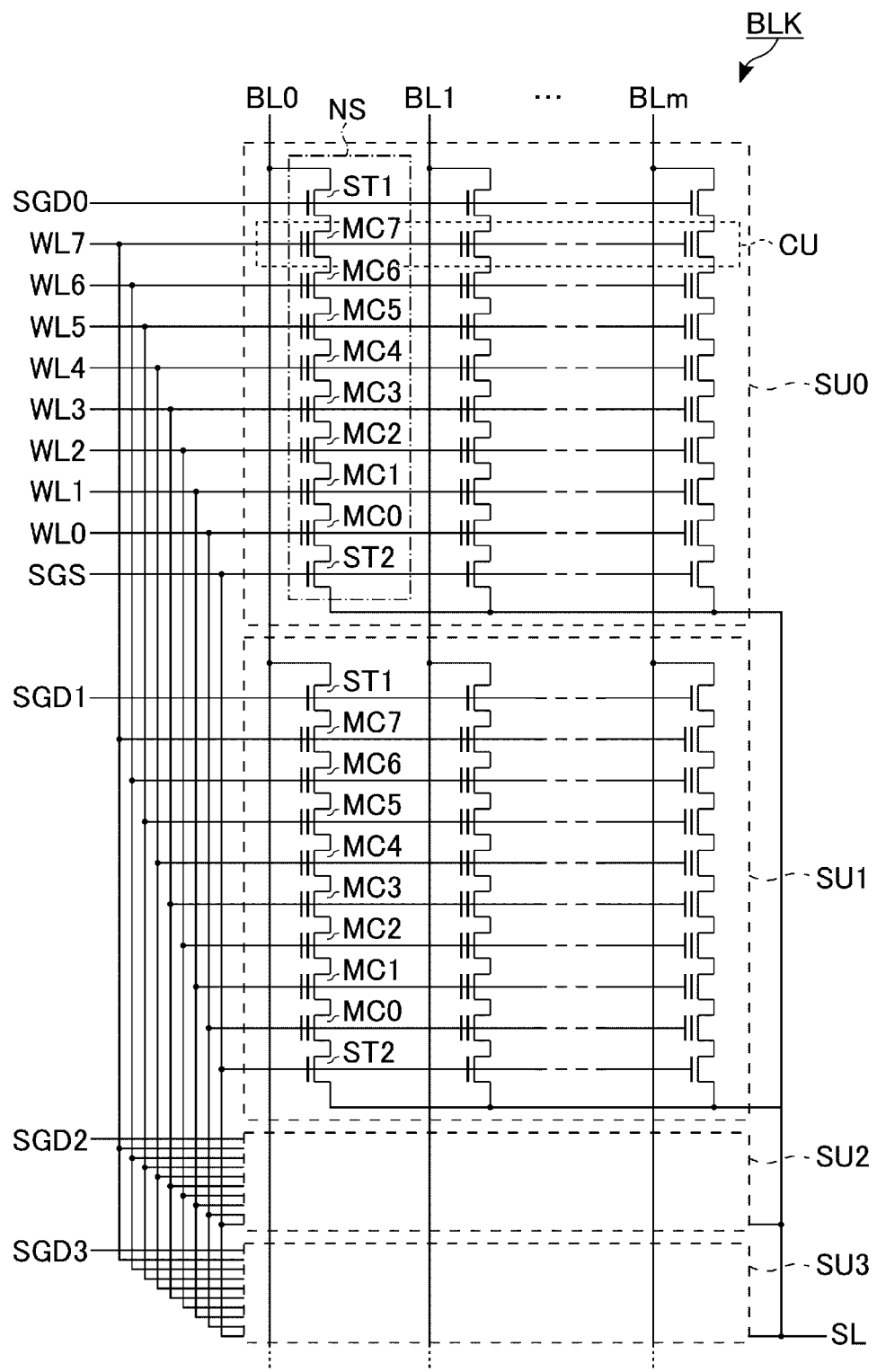
FIG. 4 is a circuit diagram of a memory cell array in the semiconductor memory device provided in the memory system according to the first embodiment.

The circuit configuration of the memory cell array 31 will be described with reference to FIG. 4. FIG. 4 is a circuit diagram of the memory cell array 31. FIG. 4 illustrates the circuit configuration of one block BLK among the plurality of blocks BLK provided in the memory cell array 31 as an example of the circuit configuration of the memory cell array 31. Another block BLK also has the configuration illustrated in FIG. 4.

The block BLk includes, for example, four string units SU0 to SU3. Each string unit SU is, for example, a set of a plurality of NAND strings NS collectively selected in the write operation or read operation. Each string unit SU includes the plurality of NAND strings NS associated with bit lines BL0 to BLm (m is an integer of 1 or more), respectively. The NAND string NS is a set of a plurality of memory cell transistors which are connected in series. Each NAND string NS includes, for example, memory cell transistors MC0 to MC7 and select transistors ST1 and ST2. The memory cell transistor MC stores the data in the non-volatile manner. The memory cell transistor MC includes a control gate and a charge accumulation layer. The select transistors ST1 and ST2 are switching elements. Each of the select transistors ST1 and ST2 is used for selecting the string unit SU in various operations.

In each NAND string NS, the memory cell transistors MC0 to MC7 are connected in series. A drain of the select transistor ST1 is connected to a corresponding bit line BL. A source of the select transistor ST1 is connected to one end of each of the memory cell transistors MC0 to MC7 which are connected in series. The drain of the select transistor ST2 is connected to the other end of each of the memory cell transistors MC0 to MC7 which are connected in series. The source of the select transistor ST2 is connected to a source line SL.

The control gates of the memory cell transistors MC0 to MC7 in the same block BLK are commonly connected to the word lines WL0 to WL7, respectively. The gates of the select transistors ST1 in the string units SU0 to SU3 are commonly connected to select gate lines SGD0 to SGD3, respectively. The gates of the select transistors ST2 provided in the same block BLK are commonly connected to a select gate line SGS.

In the circuit configuration of the memory cell array 31 described above, the bit line BL is shared by, for example, the NAND string NS in each string unit SU to which the same column address CAd is assigned. The source line SL is shared by, for example, the plurality of blocks BLK.

A set of the plurality of memory cell transistors MC connected to the common word line WL in one string unit SU is referred to as, for example, a cell unit CU. The cell unit CU is also referred to as the page. The data stored in the cell unit CU including the plurality of memory cell transistors MC each of which stores 1-bit data according to the threshold voltage, is equivalent to 1-page data. The cell unit CU may store data of two or more pages based on the number of bits of data stored by each of the memory cell transistors MC in the cell unit CU.

Note that the circuit configuration of the memory cell array 31 is not limited to the configuration described above. For example, each of the number of string units SU provided in each block BLK, the number of memory cell transistors MC provided in each NAND string NS, and the number of select transistors ST1 and ST2 may be any number. Hereinafter, the memory cell transistor MC is also referred to as a memory cell MC.

[1-1-5] Threshold Voltage Distribution of Memory Cell

Figure 5:
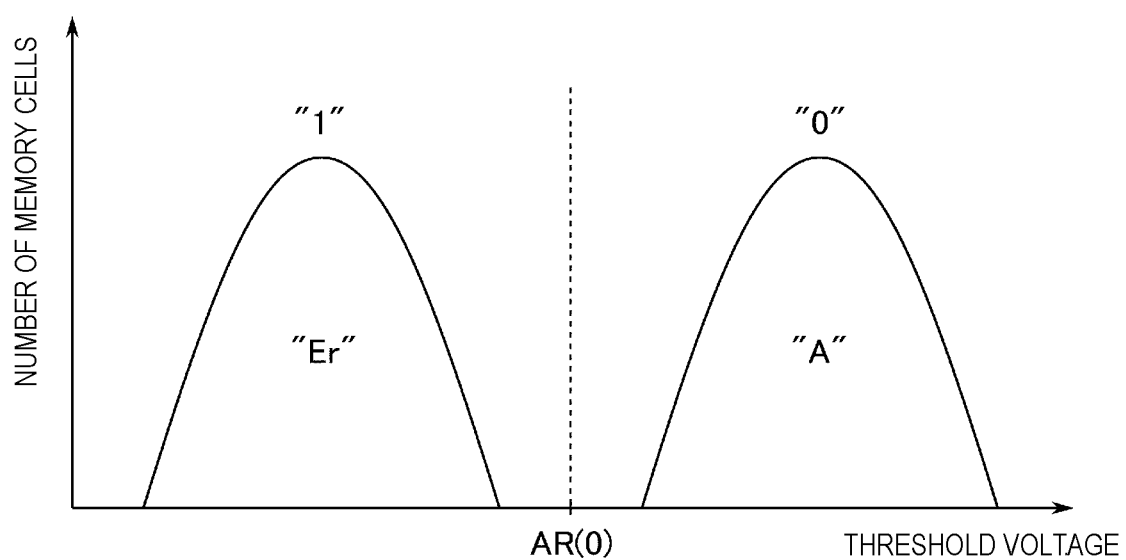
FIG. 5 is a diagram illustrating an example of a relationship between a threshold voltage distribution of a memory cell transistor provided in the memory system according to the first embodiment, and data stored by the memory cell transistor.

The threshold voltage distribution of the memory cell MC will be described with reference to FIG. 5. FIG. 5 is a diagram illustrating an example of the relationship between the threshold voltage distribution of the memory cell MC and the data stored by the memory cell MC. The horizontal axis of FIG. 5 indicates the threshold voltage of the memory cell MC. The vertical axis of FIG. 5 indicates the number of memory cells MC.

Each memory cell MC is capable of storing, for example, 1-bit data based on the threshold voltage. In this case, the threshold voltage of the memory cell MC takes a value included in one of two threshold voltage distributions. To one threshold voltage distribution having lower threshold voltages, for example, data "1" is assigned. To the other threshold voltage distribution, data "0" is assigned. Data "1" corresponds to a threshold voltage of a state in which charges are removed from the charge accumulation layer of the memory cell MC. The threshold voltage distribution of a plurality of memory cells MC corresponding to data "1" is referred to as an "Er" state. The threshold voltage of the memory cell MC corresponding to the "Er" state has a positive or negative value. Data "0" corresponds to a threshold voltage of a state in which the charges are accumulated in the charge accumulation layer of the memory cell MC. The threshold voltage distribution of a plurality of memory cells MC corresponding to data "0" is referred to as an "A" state. The threshold voltage of the memory cell MC corresponding to the "A" state is higher than that of the "Er" state. A read voltage for determining whether the threshold voltage of the memory cell MC is the "A" state is set to a voltage AR(0). For example, the threshold voltage of the memory cell MC of the "Er" state is lower than the voltage AR(0). For example, the threshold voltage of the memory cell MC of the "A" state is equal to or higher than the voltage AR(0).

For example, the sequencer 36 performs the HB read by setting the voltage AR(0) as the HB read voltage. As illustrated in FIG. 5, when the threshold voltage distribution of the "Er" state and the threshold voltage distribution of the "A" state do not overlap with each other, the memory controller 10 can determine that the threshold voltage of a certain memory cell MC belongs to the same threshold voltage distribution as the threshold voltage distribution at the time of writing, and as a result, the memory controller 10 succeeds in hard-decision decoding.

Figure 6:
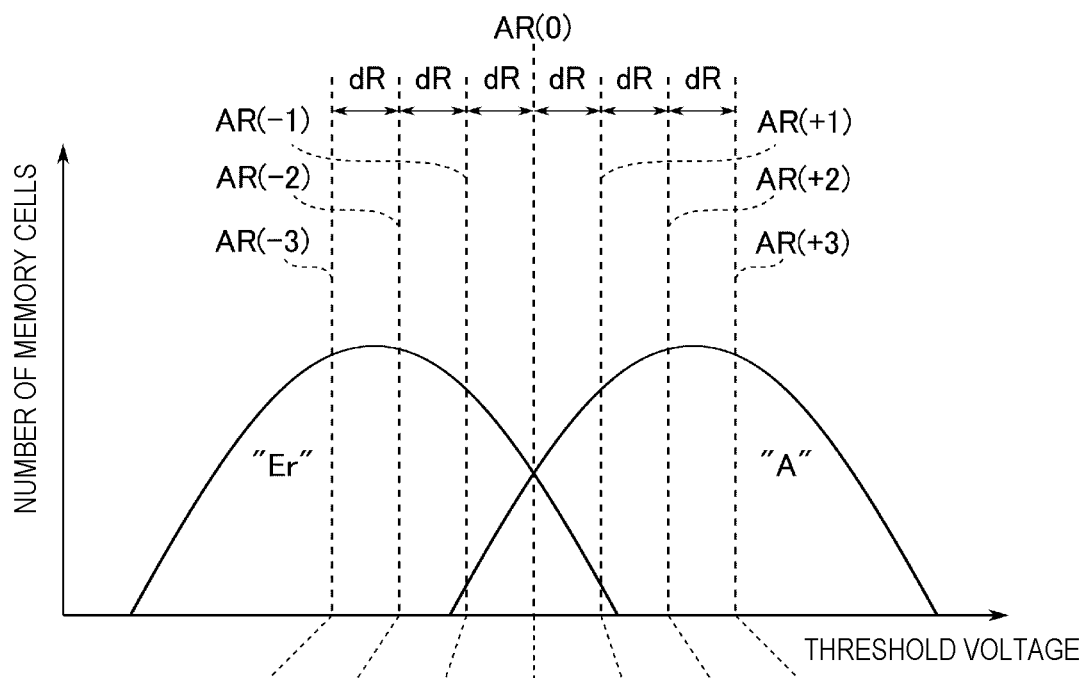
FIG. 6 is a diagram illustrating an example of a relationship among the threshold voltage distribution of the memory cell transistor provided in the memory system according to the first embodiment, a voltage for data reading, and read data.

However, as illustrated in FIG. 6, as a result of various influences on the memory cell MC, the threshold voltage distribution of the "Er" state and the threshold voltage distribution of the "A" state may overlap with each other. In this case, even when the sequencer 36 performs the HB read by setting the voltage AR(0) as the HB read voltage, a fail bit may be detected during the HB read in which the memory controller 10 cannot determine that the threshold voltage of a certain memory cell MC belongs to the same threshold voltage distribution as the threshold voltage distribution at the time of writing. When the number of fail bits exceeds an error correctable number, the memory controller 10 fails in the hard-decision decoding. When the hard-decision decoding is unsuccessful, the SB read is executed.

As illustrated in FIG. 6, the sequencer 36 performs the SB read using a plurality of SB read voltages (here, voltages AR(−3), AR(−2), AR(−1), AR(+1), AR(+2), and AR(+3)). As illustrated in FIG. 6, a voltage dR represents a shift amount of the voltage. The voltage AR(−1) is lower than the voltage AR(0) by the voltage dR. The voltage AR(−2) is lower than the voltage AR(−1) by the voltage dR. The voltage AR(−3) is lower than the voltage AR(−2) by the voltage dR. The voltage AR(+1) is higher than the voltage AR(0) by the voltage dR. The voltage AR(+2) is higher than the voltage AR(+1) by the voltage dR. The voltage AR(+3) is higher than the voltage AR(+2) by the voltage dR.

The initial values of the HB read voltage and the SB read voltage may be preset based on design and manufacturing conditions. The initial values of the HB read voltage and the SB read voltage are stored in, for example, the NAND type flash memory 30. The initial values of the HB read voltage and the SB read voltage are loaded from the NAND type flash memory 30 into the RAM 16, for example, immediately after the power is turned on. Note that the number of SB read voltages is not limited to three at each of a low-voltage side and a high-voltage side of the HB read voltage.

In the example of FIG. 6, the threshold voltages of the memory cell MC are divided by the HB read voltage (AR(0)), and six SB read voltages (AR(−3) to AR(−1) and AR(+1) to AR(+3)) and classified into eight divisions. Specifically, a threshold voltage of division D1 is lower than the voltage AR(−3). The threshold voltage of division D2 is equal to or higher than the voltage AR(−3) and lower than the voltage AR(−2). The threshold voltage of division D3 is equal to or higher than the voltage AR(−2) and lower than the voltage AR(−1). The threshold voltage of division D4 is equal to or higher than the voltage AR(−1) and lower than the voltage AR(0). The threshold voltage of division D5 is equal to or higher than the voltage AR(0) and lower than the voltage AR(+1). The threshold voltage of division D6 is equal to or higher than the voltage AR(+1) and lower than the voltage AR(+2). The threshold voltage of division D7 is equal to or higher than the voltage AR(+2) and lower than the voltage AR(+3). The threshold voltage of division D8 is equal to or higher than the voltage AR(+3).

In FIG. 6, "HB" represents a value which the hard bit may take according to the threshold voltage of the memory cell MC. The hard bit is acquired by determination of the data read from the memory cell MC in the HB read using, for example, the voltage AR(0). When the threshold voltage of the memory cell MC is in the divisions D1 to D4, the value of the hard bit is "1". When the threshold voltage of the memory cell MC is in the divisions D5 to D8, the value of the hard bit is "0".

In FIG. 6, "SB1" represents a first soft bit. The first soft bit is generated by, for example, an ENOR (exclusive NOR) operation of a plurality of pieces of data read from the memory cell MC using the voltages AR(−2) and the AR(+2), respectively. When the threshold voltage of the memory cell MC is in the divisions D1 and D2, the value of the first soft bit is "1". When the threshold voltage of the memory cell MC is in the divisions D3 to D6, the value of the first soft bit is "0". When the threshold voltage of the memory cell MC is in the divisions D7 and D8, the value of the first soft bit is "1".

In FIG. 6, "SB2" represents a second soft bit. The second soft bit is generated by, for example, an ENOR operation of a plurality of pieces of data read from the memory cell MC using the voltages AR(−3), AR(−1), AR(+1), and the AR(+3), respectively. When the threshold voltage of the memory cell MC is in the division D1, the value of the second soft bit is "1". When the threshold voltage of the memory cell MC is in the divisions D2 and D3, the value of the second soft bit is "0". When the threshold voltage of the memory cell MC is in the divisions D4 and D5, the value of the second soft bit is "1". When the threshold voltage of the memory cell MC is in the divisions D6 and D7, the value of the second soft bit is "0". When the threshold voltage of the memory cell MC is in the division D8, the value of the second soft bit is "1".

Note that a combination of a plurality of voltages used in the SB read to generate the first soft bit and the second soft bit is not limited to the above-mentioned combination.

Each of the divisions D1 to D8 includes 1 bit corresponding to the hard bit, 1 bit corresponding to the first soft bit, and 1 bit corresponding to the second soft bit. In the example of FIG. 6, indexes corresponding to the divisions D1 to D8 are set to 0 to 7, respectively. Threshold voltages in the voltage range corresponding to indexes 0 to 7, respectively, are arranged in ascending order of indexes 0, 1, 2, 3, 4, 5, 6, and 7.

[1-1-6] Processing for Soft-Decision Decoding

Figure 7:
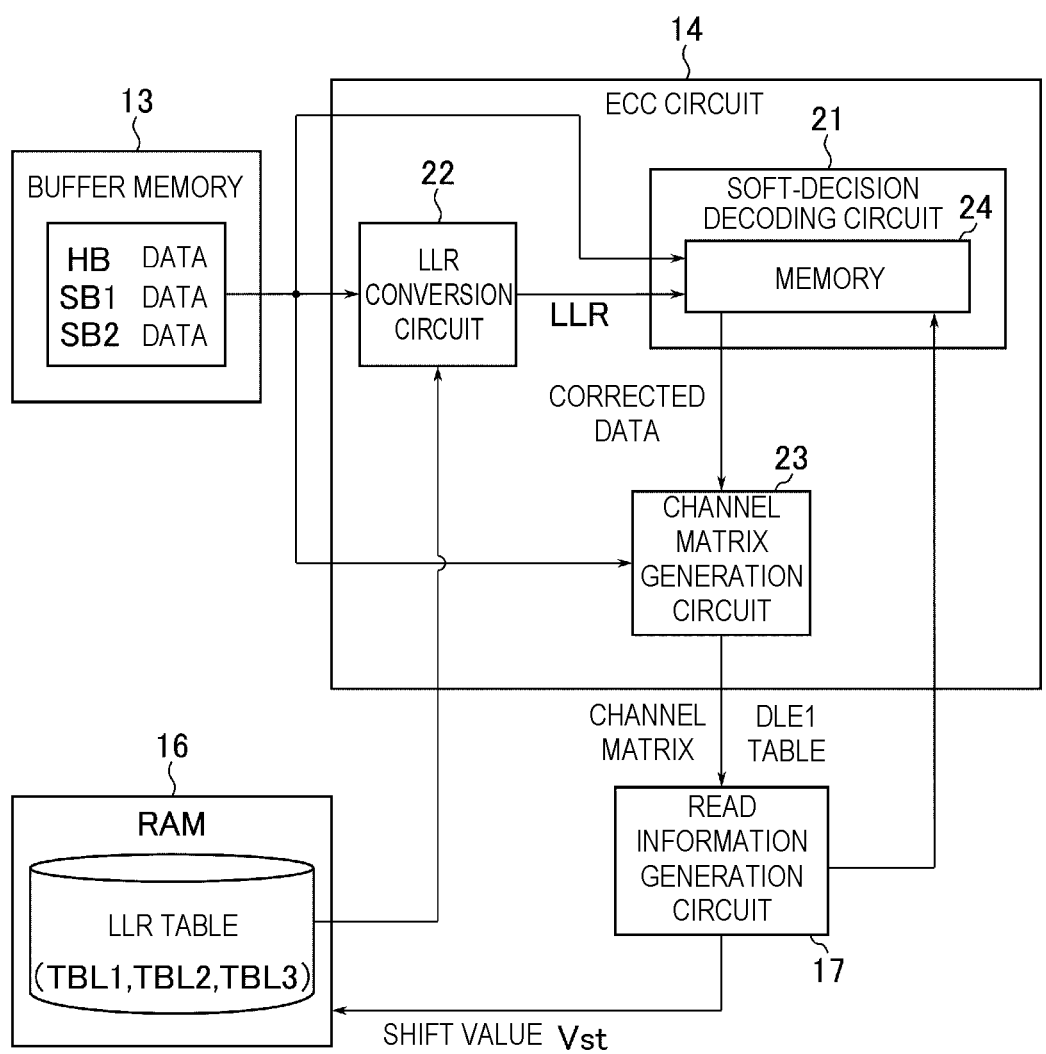
FIG. 7 is a diagram illustrating processing for soft-decision decoding according to the first embodiment.

The processing for the soft-decision decoding will be described with reference to FIG. 7. FIG. 7 is a diagram illustrating the processing for the soft-decision decoding.

[1-1-6-1] Processing of ECC Circuit

First, the processing of the ECC circuit 14 will be described.

The buffer memory 13 stores HB data, SB1 data, and SB2 data. The SB1 data includes the first soft bit for one page. The SB2 data includes the second soft bit for one page. The RAM 16 stores a plurality of LLR tables (e.g., TBL1, TBL2, and TBL3). The LLR tables TBL1, TBL2, and TBL3 are LLR tables set by considering the fluctuation of the threshold voltage of the memory cell MC due to various influences. In the LLR tables TBL1, TBL2, and TBL3, LLRs corresponding to the combination of the hard bit, the first soft bit, and the second soft bit are different from each other. The LLR conversion circuit 22 receives each of the HB data, the SB1 data, and the SB2 data from the buffer memory 13 per ECC frame. The LLR conversion circuit 22 selects any one of the plurality of LLR tables stored in the RAM 16. The LLR conversion circuit 22 converts the combination of the hard bit, the first soft bit, and the second soft bit into the LLR per ECC frame using the selected LLR table. The LLR conversion circuit 22 transmits the LLR to the soft-decision decoding circuit 21.

The LLR table will be described with reference to FIG. 8. FIG. 8 is a conceptual diagram of the LLR table.

The LLR table stores the LLR for each index indicating the combination of the hard bit, the first soft bit, and the second soft bit. The LLR takes a larger value (positive value) as a probability that the data stored in the memory cell MC is "0" increases. The LLR takes a smaller value (negative value) as the probability that the data stored in the memory cell MC is "1" increases.

As described above with reference to FIG. 6, for example, when the threshold voltage of a certain memory cell MC is in the division D1, the values of the hard bit, the first soft bit, and the second soft bit read from the memory cell MC are "1", "1", and "1", respectively. As described above, the index of the memory cell MC having the threshold voltage in the division D1 is 0 and the value of the LLR of the memory cell MC is −9. Further, when the threshold voltage of a certain memory cell MC is in the division D5, the values of the hard bit, the first soft bit, and the second soft bit read from the memory cell MC are "0", "0", and "1", respectively. As described above, the index of the memory cell MC having the threshold voltage in the division D5 is 4 and the value of the LLR of the memory cell MC is +1. The value of the LLR of FIG. 8 is just one example.

Descriptions will made while referring back to FIG. 7. The soft-decision decoding circuit 21 receives the LLR from the LLR conversion circuit 22. The soft-decision decoding circuit 21 stores the LLR in the memory 24. The soft-decision decoding circuit 21 receives the HB data, the SB1 data, and the SB2 data from the buffer memory 13 per ECC frame. The soft-decision decoding circuit 21 stores the HB data, the SB1 data, and the SB2 data in the memory 24. The soft-decision decoding circuit 21 performs the error correction of the user data using the soft-decision parity among the LLR, the HB data, the SB1 data, and the SB2 data. The soft-decision decoding circuit 21 stores the corrected data in the memory 24. The soft-decision decoding circuit 21 transmits the corrected data to the channel matrix generation circuit 23.

The channel matrix generation circuit 23 receives the HB data, the SB1 data, and the SB2 data from the buffer memory 13 per ECC frame. The channel matrix generation circuit 23 receives the corrected data from the memory 24. The channel matrix generation circuit 23 acquires the index based on the HB data, the SB1 data, and the SB2 data. The channel matrix generation circuit 23 counts the numbers DLECNT of data "0" and data "1" in the corrected data every index to generate the channel matrix. The channel matrix generation circuit 23 transmits the generated channel matrix to the read information generation circuit 17.

The channel matrix will be described with reference to FIG. 9. FIG. 9 is a table illustrating an example of the channel matrix.

In the example of FIG. 9, a size of the channel matrix is two rows and eight columns. The row indicates the numbers DLECNT of data "0" and data "1" in the corrected data. Here, num1[0] to num1[7] represent the number of data "1". Also, num0[0] to num0[7] represent the number of data "0". The column represents the index.

For example, when the value of any bit in the corrected data is "1" and the index corresponding to the bit is 0, an element num1[0] of a first row and a first column is incremented by 1. That is, num1[0] represents the number of memory cells MC that have the threshold voltage in the division D1 and store data "1". For example, when the value of any bit in the corrected data is "0" and the index corresponding to the bit is 0, an element num0[0] of a second row and the first column is incremented by 1. That is, num0[0] represents the number of memory cells MC that have the threshold voltage in the division D1 and store data "0".

Similarly, when the value of any bit in the corrected data is "1" and the index corresponding to the bit is 4, an element num1[4] of the first row and a fifth column is incremented by 1. That is, num1[4] represents the number of memory cells MC that have the threshold voltage in the division D5 and store data "1". Further, when the value of any bit in the corrected data is "0" and the index corresponding to the bit is 4, an element num0 [4] of the second row and the fifth column is incremented by 1. That is, num0 [4] represents the number of memory cells MC that have the threshold voltage in the division D5 and store data "0".

[1-1-6-2] Processing of Read Information Generation Circuit

Next, the processing of the read information generation circuit 17 will be described.

Description will be made while referring back to FIG. 7. The read information generation circuit 17 receives the channel matrix from the channel matrix generation circuit 23.

(DLE1 Table Generation Processing)

The read information generation circuit 17 generates the DLE1 table by statistically calculating the likelihood ratio (specifically, LLR) of the bit for each index using the channel matrix. Specifically, LLR[idx] is calculated for each index in the following Equation (1).

$$LLR[idx] = \ln \frac{\frac{num0[idx]}{\sum_{k=0}^{t} num0[s]}}{\frac{num1[idx]}{\sum_{k=0}^{t} num1[s]}} \quad (1)$$

Equation (1) is converted as Equation (2) below.

$$LLR[idx] = \ln \frac{num0[idx] \times \sum_{k=0}^{t} num1[s]}{num1[idx] \times \sum_{k=0}^{t} num0[s]} \quad (2)$$

In the above equations, "idx" represents the value of the index; "s" represents an integer of 0 or more and t or less; and "t" represents the value obtained by subtracting 1 from the number of indexes. The calculated LLR is saturated at, for example, an integer of which absolute value is 9 or less. That is, when the calculated LLR is smaller than −9, the LLR becomes −9. When the calculated LLR is larger than 9, the LLR becomes +9.

(Shift Value Generation Processing)

Figure 10A:
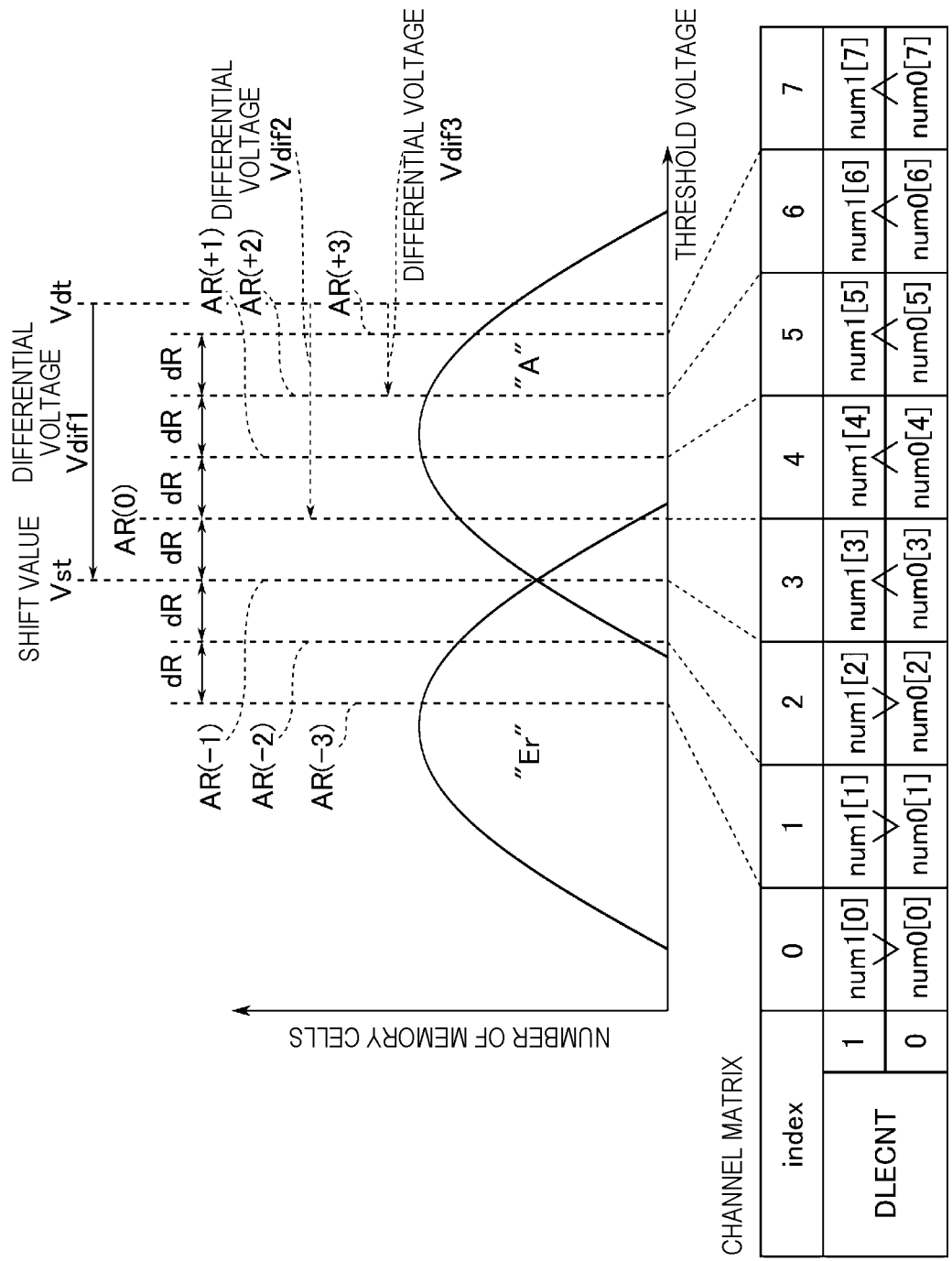
FIGS. 10A-10E are diagrams illustrating generation processing of a shift value according to the first embodiment.

The generation processing of the shift value Vst will be described with reference to FIGS. 10A to 10E. FIG. 10A is a diagram illustrating the generation processing of the shift value Vst. FIGS. 10B to 10E are diagrams illustrating the relationship between the threshold voltage distribution of the memory cell MC and the channel matrix.

The read information generation circuit 17 generates the shift value Vst using the channel matrix. Specifically, the read information generation circuit 17 uses the number DLECNT (num1[0] to num1 [7]) of data "1" and the number DLECNT (num0 [0] to num0[7]) of data "0" for each index of the channel matrix. For example, an area indicated by a hatched line of FIG. 10B corresponds to the number DLECNT (num1 [2]) that indicates the number of memory cells MC included in a voltage range corresponding to index 2 and storing "1" in the corrected data (i.e., data of which error correction is successful), among the plurality of memory cells MC. An area indicated by a hatched line of FIG. 10C corresponds to the number DLECNT (num0[2]) that indicates the number of memory cells MC included in the voltage range corresponding to index 2 and storing "0" in the corrected data, among the plurality of memory cells MC. An area surrounded by diagonal hatched line of FIG. 10D corresponds to the number DLECNT (num1 [3]) that indicates the number of memory cells MC included in the voltage range corresponding to index 3 and storing "1" in the corrected data, among the plurality of memory cells MC. An area indicated by a hatched line of FIG. 10E corresponds to the number DLECNT (num0[3]) that indicates the number of memory cells MC included in the voltage range corresponding to index 3 and storing "0" in the corrected data, among the plurality of memory cells MC.

Figure 10B:
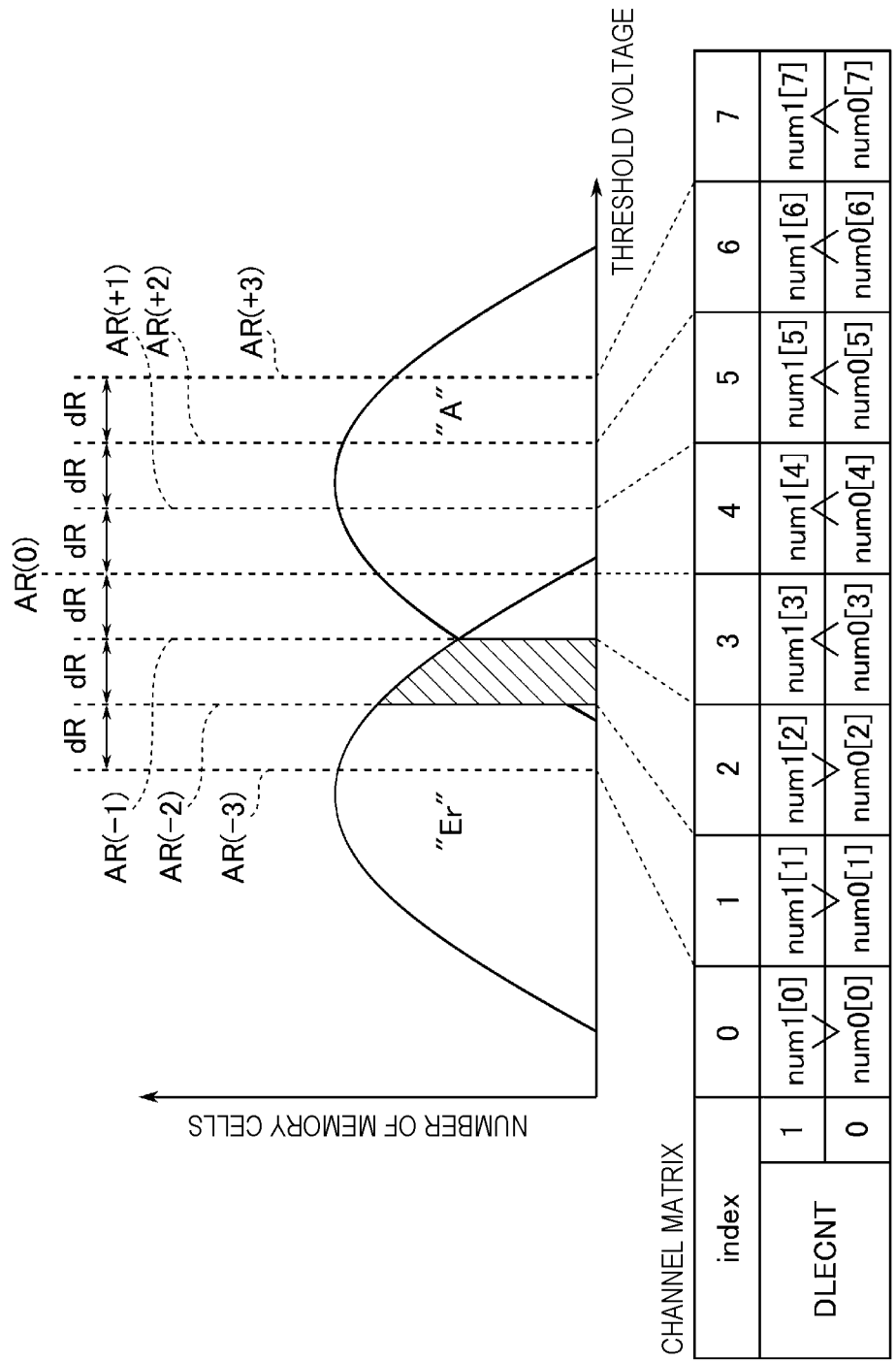
Figure 10C:
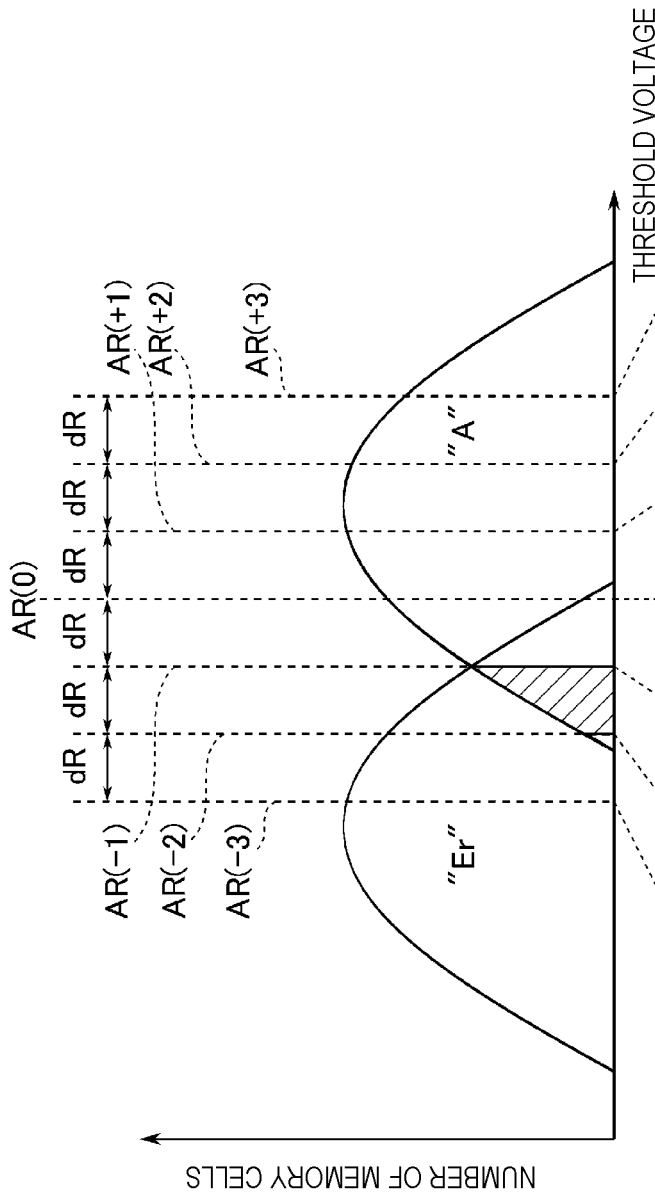
Figure 10D:
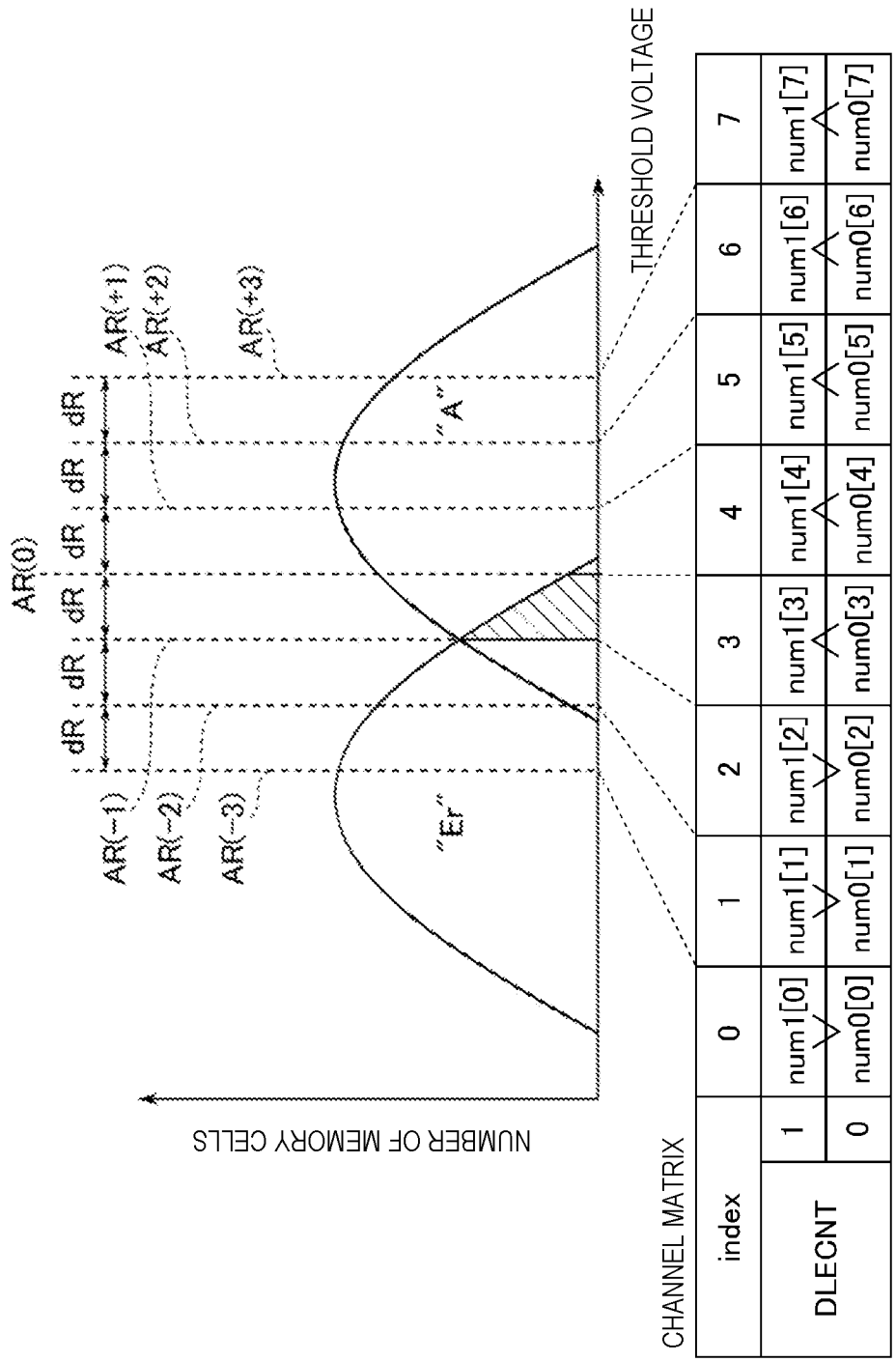
Figure 10E:
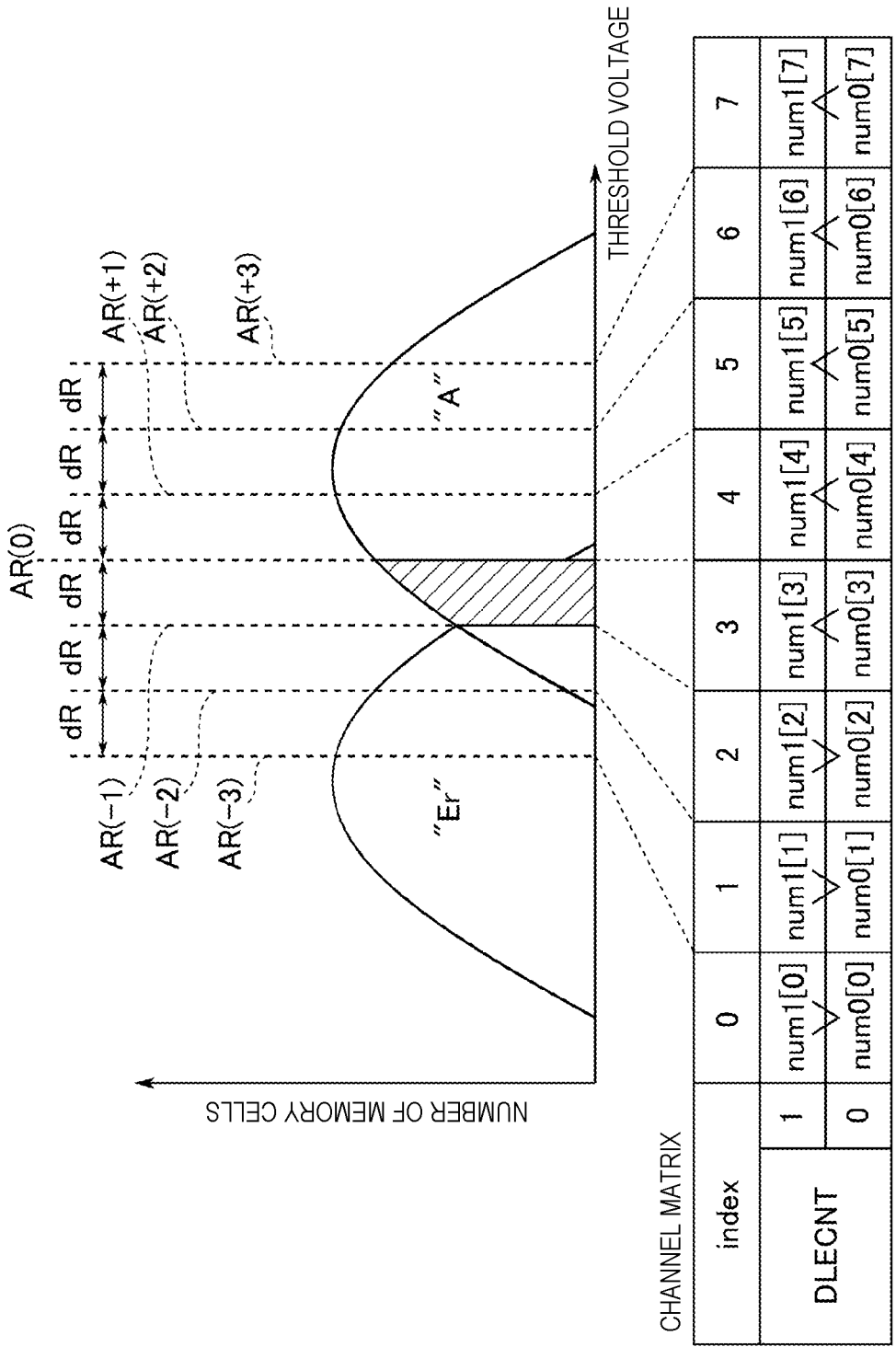

The read information generation circuit 17 compares the number DLECNT of data "1" and the number DLECNT of data "0" in order from the first column of the channel matrix. The read information generation circuit 17 detects a column in which the magnitude of the number DLECNT of data "1" and the number DLECNT of data "0" is flipped. As illustrated in FIGS. 10B and 10C, in the third column of the channel matrix corresponding to index 2 (division D3), the number of data "1" (num1 [2]) is larger than the number of data "0" (num0[2]). As illustrated in FIGS. 10D and 10E, in the fourth column of the channel matrix corresponding to index 3 (division D4), the number of data "0" (num0[3]) is larger than the number of data "1" (num1[3]). The magnitude of the number of data "1" and the number of data "0" is flipped on a boundary of a voltage of an intersection where two threshold voltage distributions of the memory cell MC overlap. In other words, it is estimated that the intersection where two threshold voltage distributions of the memory cell MC overlap corresponding to the point where the magnitude of the number of data "1" and the number of data "0" is flipped. Accordingly, in the channel matrix, the column in which the magnitude of the number of data "1" and the number of data "0" is flipped is detected to acquire the location where the number of error bits is relatively small, that is, the intersection where two threshold voltage distributions of the memory cell MC overlap.

As such, searching for the intersection where two threshold voltage distributions overlap is referred to as "tracking". The read information generation circuit 17 acquires a voltage (a voltage acquired by the tracking) that is set between the column where the magnitude is flipped, and a column corresponding to a division in which the threshold voltage is lower than the column by the voltage dR. The read information generation circuit 17 generates the shift value Vst as a result of adding to or subtracting from the default voltage Vdt, a differential voltage between the voltage acquired by the tracking (hereinafter, also referred to as a "tracking voltage Vtr") and the default voltage Vdt.

In the example illustrated in FIG. 10A, as described above, the number (num1[2]) of memory cells MC having the threshold voltage corresponding to index 2 (division D3) and storing data "1" is larger than the number (num0[2]) of memory cells MC having the threshold voltage corresponding to index 2 and storing data "0". Further, the number (num1 [3]) of memory cells MC having the threshold voltage corresponding to index 3 (division D4) and storing data "1" is smaller than the number (num0[3]) of memory cells MC having the threshold voltage corresponding to index 3 and storing data "0". That is, in the example illustrated in FIG. 10A, the magnitude of the DLECNT is flipped between the third column and the fourth column of the channel matrix, that is, the left and right of the SB read voltage AR(−1). It is estimated that the intersection where two threshold voltage distributions of the memory cell MC overlap deviates to a 1×dR low-voltage side from the HB read voltage AR(0). In this case, the read information generation circuit 17 calculates the tracking voltage Vtr (the voltage of the intersection where two threshold voltage distributions overlap) at least based on the number (num1 [2]) of data "1" of index 2 and the number (num0[2]) of data "0" of index 2. Further, the read information generation circuit 17 calculates the tracking voltage Vtr further based on the number (num1 [3]) of data "1" of index 3 and the number (num0[3]) of data "0" of index 3. For example, when any voltage in the voltage range corresponding to index 2 is lower than any voltage in the voltage range corresponding to index 3, the read information generation circuit 17 calculates the tracking voltage Vtr (e.g., voltage AR(−1)) from a voltage range between the voltage range corresponding to index 2 and the voltage range corresponding to index 3, according to num1 [2] being larger than num0 [2] and num1 [3] being smaller than num0 [3]. In addition, the read information generation circuit 17 generates, as the shift value Vst, a result of adding or subtracting a differential voltage (Vdif1 in the example of FIG. 10A) between the tracking voltage Vtr (voltage AR(−1)) and the default voltage Vdt to or from the default voltage Vdt.

Further, for example, when the magnitude of the DLECNT is flipped between the left and right columns of the HB read voltage AR(0), the read information generation circuit 17 generates, as the shift value Vst, a result of adding or subtracting a differential voltage (Vdif2 in the example of FIG. 10A) between the voltage AR(0) and the default voltage Vdt to or from the default voltage Vdt. When the magnitude of the DLECNT is flipped between the left and right columns of the SB read voltage AR(+2), the read information generation circuit 17 generates, as the shift value Vst, a result of adding or subtracting a differential voltage (Vdif3 in the example of FIG. 10A) between the voltage AR(+2) and the default voltage Vdt to or from the default voltage Vdt.

Note that, as understood from Equation (1) or (2), when the number of memory cells MC storing data "1" among the memory cells MC having the threshold voltage corresponding to any index idx is larger than the number of memory cells MC storing data "0" (i.e., when num1[idx]>num0[idx]), a sign of LLR[idx] corresponding to the index idx becomes negative. Meanwhile, when the number of memory cells MC storing data "1" among the memory cells MC having the threshold voltage corresponding to any index idx is smaller than the number of memory cells MC storing data "0" (i.e., when num1[idx]<num0[idx]), the sign of LLR[idx] corresponding to the index idx becomes positive. That is, the index in which the magnitude of the DLECNT is flipped in the channel matrix and the index in which the sign of the LLR is inverted in the DLE1 table are the same as each other.

(DLE1 Table Correction Processing)

The correction processing of the DLE1 table will be described with reference to FIGS. 11A to 11C. FIGS. 11A to 11C are diagrams illustrating the correction processing of the DLE1 table. FIG. 11A illustrates an example of a case where the intersection (i.e., the tracking voltage Vtr) of two threshold voltage distributions of the memory cell MC is the voltage AR(−1).

As illustrated in FIG. 11A, the DLE1 table includes the LLRs corresponding to the voltage ranges corresponding to indexes 0 to 7, respectively. Hereinafter, the LLRs corresponding to the voltage ranges corresponding to indexes 0 to 7 are also referred to as "LLR of index 0", "LLR of index 1", . . . , "LLR of index 7", respectively. After the generation of the DLE1 table, for example, the LLR of index 2 is −1. The LLR of index 3 is +1.

The read information generation circuit 17 acquires a voltage difference between the HB read voltage of which SB correction is successful, that is, a voltage applied to the word line when the data of which SB correction is successful is acquired (here, the voltage AR(0) is assumed), and the tracking voltage Vtr (here, voltage AR(−1) is assumed). The read information generation circuit 17 corrects the DLE1 table based on the acquired voltage difference.

Specifically, the read information generation circuit 17 shifts each LLR of the DLE1 table based on the acquired voltage difference. In FIG. 11A, the read information generation circuit 17 shifts the respective LLRs of indexes 0 to 5 of the DLE1 table in a right direction by 1. The LLR (=−5) of index 0 is shifted to index 1. The LLR (=−3) of index 1 is shifted to index 2. The LLR (=−1) of index 2 is shifted to index 3. That is, when the HB read voltage of which SB correction is successful is larger than the tracking voltage Vtr, the read information generation circuit 17 stores the LLR (=−1) stored in index 2 of the DLE1 table before correction as the LLR of index 3 of the DLE1 table after correction. The LLR (=+1) of index 3 is shifted to index 4. The LLR (=+3) of index 4 is shifted to index 5. The LLR (=+5) of index 5 is shifted to index 6. Since the LLR (=+9) of index 7 is to be replaced with an integrated value that will be described below, the LLR of index 7 is deleted once. At this time, the LLRs are not included in indexes 0 and 7 by the shift of the LLRs.

The read information generation circuit 17 calculates the LLR of index 7 (hereinafter, also referred to as an "integrated value") based on DLECNTs of the plurality of indexes of the channel matrix using Equation (1). In the case of the example illustrated in FIG. 11A, the read information generation circuit 17 substitutes a sum of the number (num0[6]) of "0" of index 6 of the channel matrix and the number (num0[7]) of "0" of index 7 into num0[idx] of Equation (1). The read information generation circuit 17 substitutes a sum of the number (num1 [6]) of "1" of index 6 of the channel matrix and the number (num1 [7]) of "1" of index 7 into num1[idx] of Equation (1). That is, the read information generation circuit 17 calculates the integrated value based on num0 [6] and num0 [7], and num1[6] and num1[7]. When the value calculated using Equation (1) is larger than +9, the read information generation circuit 17 sets +9 as the integrated value. Here, it is assumed that the read information generation circuit 17 calculates +9 as the integrated value. The read information generation circuit 17 sets the calculated +9 as the LLR of index 7 of the DLE1 table.

The read information generation circuit 17 sets a value (=−9) acquired by inverting the sign of the integrated value (the LLR of index 7) as the LLR of index 0 of the DLE1 table. As a result, the correction processing of the DLE1 table is completed.

FIG. 11B illustrates an example of a case where the voltage applied to the word line when the data of which SB correction is successful is acquired is the voltage AR(0), and the intersection of two threshold voltage distributions of the memory cell MC is in the voltage AR(−2).

In FIG. 11B, the read information generation circuit 17 shifts the respective LLRs of indexes 0 to 4 of the DLE1 table in the right direction by 2. The LLR (=−3) of index 0 is shifted to index 2. The LLR (=−1) of index 1 is shifted to index 3. The LLR (=+1) of index 2 is shifted to index 4. The LLR (=+3) of index 3 is shifted to index 5. The LLR (=+5) of index 4 is shifted to index 6. Since the LLR (=+9) of index 7 is to be replaced with the integrated value, the LLR of index 7 is deleted once. At this time, the LLRs are not included in indexes 0, 1, and 7 by the shift of the LLRs.

The read information generation circuit 17 calculates the integrated value based on three DLECNTs of indexes 5 to 7 of the channel matrix using Equation (1). In the case of the example illustrated in FIG. 11B, the read information generation circuit 17 substitutes a sum of the number (num0[5]) of "0" of index 5 of the channel matrix, the number (num0[6]) of "0" of index 6, and the number (num0[7]) of "0" of index 7 into num0[idx] of Equation (1). The read information generation circuit 17 substitutes a sum of the number (num1[5]) of "1" of index 5 of the channel matrix, the number (num1 [6]) of "1" of index 6, and the number (num1[7]) of "1" of index 7 into num1[idx] of Equation (1). Here, it is assumed that the read information generation circuit 17 calculates +9 as the integrated value. The read information generation circuit 17 sets the calculated +9 as the LLR of index 7 of the DLE1 table. The read information generation circuit 17 sets a value (=−9) acquired by inverting the sign of the integrated value (the LLR of index 7) as the LLR of index 0 of the DLE1 table. The read information generation circuit 17 sets a value (=−5) acquired by inverting the sign of LLR (=+5) of index 6 of the DLE1 table as the LLR of index 1 of the DLE1 table.

The number of SB read voltages is represented by (k×2) (k is an integer of 1 or more), and the indexes of the channel matrix and the DLE1 table are represented by integers which are 0 or more and ((k×2)+1) or less. When the intersection of two threshold voltage distributions of the memory cell MC is a voltage AR(−j) rather than the HB read voltage of which SB correction is successful (j is an integer of 1 or more and k or less), the read information generation circuit 17 shifts the LLRs of indexes 0 to ((k×2) −j) of the DLE1 table to the right by j. The read information generation circuit 17 calculates the integrated value based on (j+1) DLECNTs included in indexes ((k×2) j+1) to ((k×2)+1) of the channel matrix. The read information generation circuit 17 sets the calculated integrated value as the LLR of index ((k×2)+1) of the DLE1 table. The read information generation circuit 17 sets values acquired by inverting the signs of LLRs of indexes ((k×2)+1) to ((k×2)+1−(j−1) of the DLE1 table as the LLRs of indexes 0 to (j−1)) of the DLE1 table.

FIG. 11C illustrates an example of a case where the voltage applied to the word line when the data of which SB correction is successful is acquired is the voltage AR(0), and the intersection of two threshold voltage distributions of the memory cell MC is in the voltage AR(+1).

As illustrated in FIG. 11C, after the generation of the DLE1 table, for example, the LLR of index 2 is −5. The LLR of index 3 is −3.

In FIG. 11C, the read information generation circuit 17 shifts the respective LLRs of indexes 2 to 7 of the DLE1 table in a left direction by 1. The LLR (=+5) of index 7 is shifted to index 6. The LLR (=+3) of index 6 is shifted to index 5. The LLR (=+1) of index 5 is shifted to index 4. The LLR (=−1) of index 4 is shifted to index 3. The LLR (=−3) of index 3 is shifted to index 2. That is, when the HB read voltage of which SB correction is successful is smaller than the tracking voltage Vtr, the read information generation circuit 17 stores the LLR (=−3) stored in index 3 of the DLE1 table before correction as the LLR of index 2 of the DLE1 table after correction. The LLR (=−5) of index 2 is shifted to index 1. Since the LLR (=−9) of index 0 is to be replaced with the integrated value, the LLR of index 0 is deleted once. At this time, the LLRs are not included in indexes 0 and 7 by the shift of the LLRs.

The read information generation circuit 17 calculates the integrated value based on two DLECNTs of indexes 0 to 1 of the channel matrix using Equation (1). In the case of the example illustrated in FIG. 11C, the read information generation circuit 17 substitutes a sum of the number (num0[0]) of "0" of index 0 of the channel matrix and the number (num0[1]) of "0" of index 1 into num0[idx] of Equation (1). The read information generation circuit 17 substitutes a sum of the number (num1 [0]) of "1" of index 0 of the channel matrix and the number (num1 [1]) of "1" of index 1 into num1[idx] of Equation (1). When the value calculated using Equation (1) is smaller than −9, the read information generation circuit 17 sets −9 as the integrated value. Here, it is assumed that the read information generation circuit 17 calculates −9 as the integrated value. The read information generation circuit 17 sets the calculated −9 as the LLR of index 0 of the DLE1 table. The read information generation circuit 17 sets a value (=+9) acquired by inverting the sign of the integrated value (the LLR of index 0) as the LLR of index 7 of the DLE1 table.

As such, when the intersection of two threshold voltage distributions of the memory cell MC is a voltage AR(+j) rather than the HB read voltage of which SB correction is successful, the read information generation circuit 17 shifts the LLRs of indexes (j+1) to ((k×2)+1) of the DLE1 table to the left by j. The read information generation circuit 17 calculates the integrated value based on (j+1) DLECNTs included in indexes 0 to j of the channel matrix. The read information generation circuit 17 sets the calculated integrated value as the LLR of index 0 of the DLE1 table. The read information generation circuit 17 sets values acquired by inverting the signs of LLRs of indexes 0 to (j−1) of the DLE1 table as the LLRs of indexes ((k×2)+1) to ((k×2)+1−(j−1)) of the DLE1 table.

Descriptions will be made while referring back to FIG. 7. The read information generation circuit 17 transmits the shift value Vst generated by the shift value generation processing to the RAM 16. The shift value Vst is applied to the HB read voltage when the read operation of a next page in the same block BLK is performed. In the read operation of the next page in the same block BLK, the memory controller 10 performs the HB read using the HB read voltage to which the shift value Vst is applied. The memory controller 10 performs the SB read using a plurality of SB read voltages based on the HB read voltage to which the shift value Vst is applied.

The read information generation circuit 17 transmits the DLE1 table generated by the DLE1 table generation processing to the memory 24. The generated DLE1 table is used as the LLR table when the soft-decision decoding circuit 21 performs the SB correction of a next ECC frame in the same page, for example, until the DLE1 table correction processing is performed. The read information generation circuit 17 transmits the DLE1 table corrected by the DLE1 table correction processing to the memory 24. When the DLE1 table is already stored in the memory 24, the DLE1 table is overwritten with the corrected DLE1 table. The corrected DLE1 table is used as the LLR table, for example, when the soft-decision decoding circuit 21 performs the SB correction of a next ECC frame in the same page. Further, when the soft-decision decoding circuit 21 performs multiple SB corrections for any ECC frame, the soft-decision decoding circuit 21 may select the LLR tables in the order of, for example, an LLR table TBL1, the DLE1 table stored in the memory 24, the LLR table TBL2, and the LLR table TBL3.

[1-2] Read Operation

Figure 12:
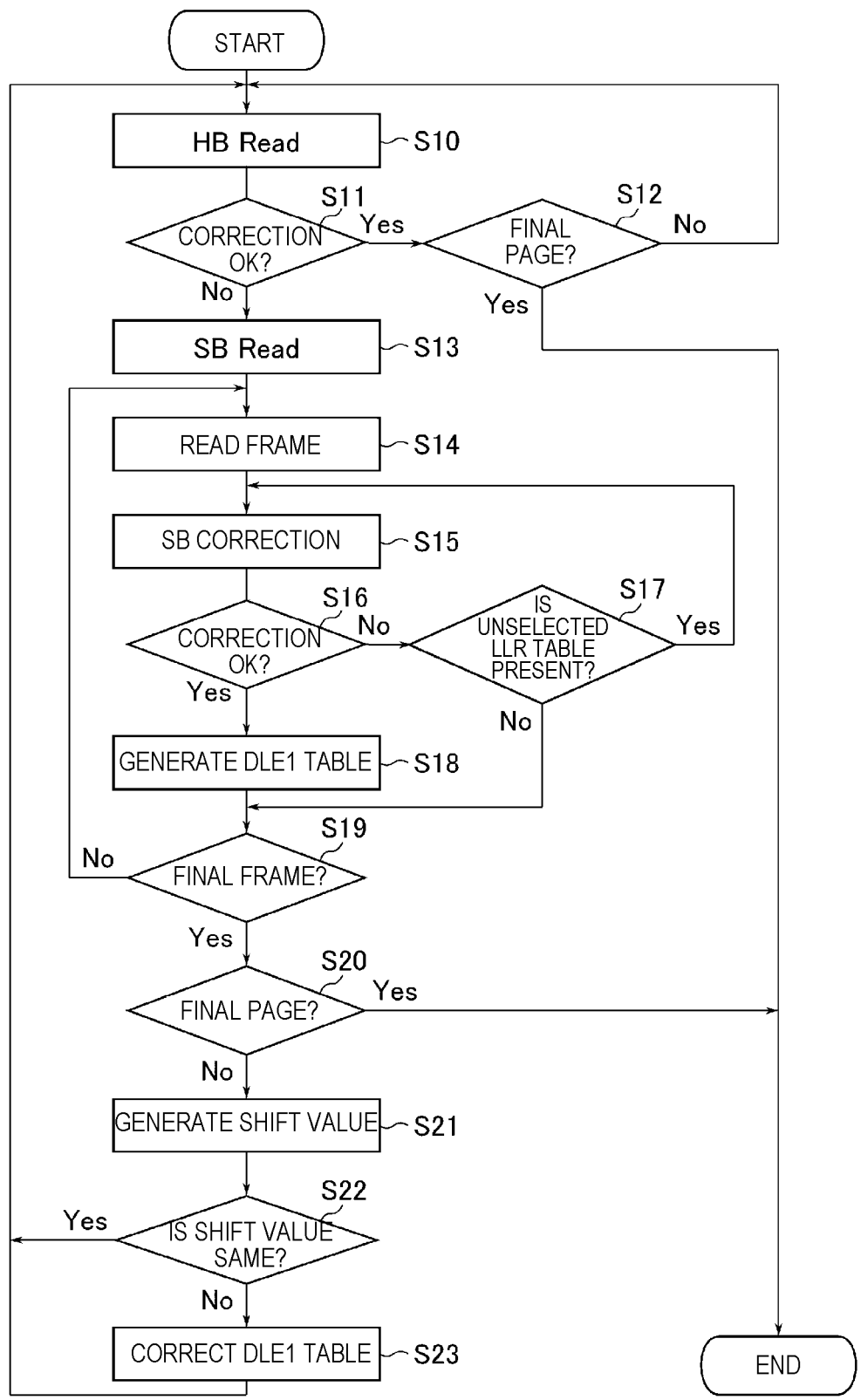
FIG. 12 is a flowchart illustrating a read operation by the memory controller provided in the memory system according to the first embodiment.

The read operation will be described with reference to FIG. 12. FIG. 12 is a flowchart illustrating the read operation by the memory controller 10 provided in the memory system 1 according to the embodiment. Hereinafter, a case where a cell unit CU stores 1-page data will be described as an example.

When the read operation is started, the memory controller 10 first applies the HB read voltage to the selected word line to perform the read (the HB read) of the HB data corresponding to one page in any block BLK (S10). Here, one word line (hereinafter, also referred to as a "first word line") included in the block BLK is selected. The HB read voltage is set based on the default voltage value Vdt or the shift value Vst stored in the RAM 16. The read HB data (i.e., acquired from the plurality of memory cells MC connected to the first word line) is stored in the buffer memory 13.

After executing the HB read, the memory controller 10 receives the HB data from the buffer memory 13 per ECC frame. The hard-decision decoding circuit 20 corrects the error of the user data of the ECC frame (HB correction).

When the HB correction of all ECC frames of the HB data corresponding to one page is successful (S11_Yes), and when a current page is not a final page (hereinafter, just referred to as a "final page") to be read in the same block BLK (S12_No), the memory controller 10 executes the processing of step S10 for the next page in the same block BLK. When the current page is the final page (S12_Yes), the memory controller 10 terminates the read operation.

Meanwhile, when the HB correction of at least one ECC frame of the HB data corresponding to one page is not successful (S11_No), the memory controller 10 applies a plurality of SB read voltages to the selected word line to perform the read (SB read) of a plurality of pieces of SB data (e.g., SB1 data and SB2 data) (S13). The plurality of SB read voltages are set based on the HB read voltage. The read SB1 data and SB2 data (i.e., acquired from the plurality of memory cells MC connected to the first word line) are stored in the buffer memory 13.

After executing the SB read, the memory controller 10 receives the HB data, the SB1 data, and the SB2 data from the buffer memory 13 per ECC frame (S14).

The LLR conversion circuit 22 selects any one of the plurality of LLR tables. The LLR conversion circuit 22 converts the combination of the hard bit, the first soft bit, and the second soft bit into the LLR per ECC frame using the selected LLR table. The soft-decision decoding circuit 21 corrects the error of the user data of the ECC frame (SB correction) using the soft-decision parity among the LLR, the HB data, the SB1 data, and the SB2 data (S15).

When the SB correction of the ECC frame is successful (S16_Yes), the read information generation circuit 17 generates the DLE1 table based on the data corrected by the SB correction, which is acquired from the plurality of memory cells MC connected to the first word line (S18). The generated DLE1 table is stored in the memory 24.

Meanwhile, when the SB correction of the ECC frame is not successful (S16_No), and when there is no unselected LLR table for the same ECC frame (S17_No), the memory controller 10 executes processing of step S19 to be described later. Although a detailed description is omitted, the memory controller 10 may perform an additional error correction on the ECC frame using another, stronger error correction method such as a product-code before executing the processing of step S19. Alternatively, the memory controller 10 may notify the host device 2 of an uncorrectable error before executing the processing of step S19. When there is the unselected LLR table for the same ECC frame (S17_Yes), the memory controller 10 executes the processing of step S15 using a next LLR table. Further, "unselected LLR table" means, for example, an LLR table which is not selected among the LLR tables TBL1, TBL2, and TBL3, and the DLE1 table.

Note that, when performing the SB correction of any ECC frame, the soft-decision decoding circuit 21 first performs the SB correction using, for example, the LLR table TBL1 stored in the RAM 16. When the SB correction is not successful, and when the DLE1 table is stored in the memory 24, the soft-decision decoding circuit 21 performs the SB correction using the DLE1 table. When the SB correction is not successful or when the DLE1 table is not stored in the memory 24, the soft-decision decoding circuit 21 performs the SB correction using the LLR table TBL2 stored in the RAM 16. When the SB correction is not successful, the soft-decision decoding circuit 21 performs the SB correction using the LLR table TBL3 stored in the RAM 16.

After the DLE1 table generation processing in step S18 or when there is no unselected LLR table (S17_No), the memory controller 10 determines whether a current ECC frame is a final ECC frame (hereinafter, referred to as a "final ECC frame") in the same page. When the current ECC frame is not the final ECC frame (S19_No), the memory controller 10 executes the processing of step S14 for the next ECC frame in the same page. Meanwhile, when the current ECC frame is the final ECC frame (S19_Yes), and when the current page is the final page (S20_Yes), the memory controller 10 terminates the read operation. When the current page is not the final page (S20_No), the read information generation circuit 17 generates the shift value Vst (S21). The generated shift value Vst is stored in the RAM 16 after processing step S22 to be described later.

When the generated shift value Vst is the same as the shift value stored in the RAM 16 (S22_Yes), the memory controller 10 executes the processing of step S10 for the next page in the same block BLK. Meanwhile, when the generated shift value Vst is not the same as the shift value stored in the RAM 16 (S22_No), the read information generation circuit 17 corrects the DLE1 table (S23) based on a voltage difference between the voltage applied to the first word line when the data of which SB correction is successful is acquired, and the tracking voltage Vtr. The corrected DLE1 table is stored in the memory 24. Thereafter, the memory controller 10 executes the processing of step S10 for the next page in the same block BLK.

The processing for the next page in the same block BLK will be described, for example, as below. In the processing of step S10, one word line different from the first word line included in the same block BLK (hereinafter, also referred to as a "second word line") is selected and the memory controller 10 applies the HB read voltage (the shift value Vst, i.e., the tracking voltage Vtr) to the second word line to perform the HB read. In the processing of step S13, the memory controller 10 applies the plurality of SB read voltages to the second word line to perform the SB read. In the processing of step S16, the memory controller 10 performs the error correction for the data acquired from the plurality of memory cells MC connected to the second word line using the DLE1 table corrected based on the data acquired from the plurality of memory cells MC connected to the first word line included in the same block BLK.

[1-3] Effect

Figure 13A:
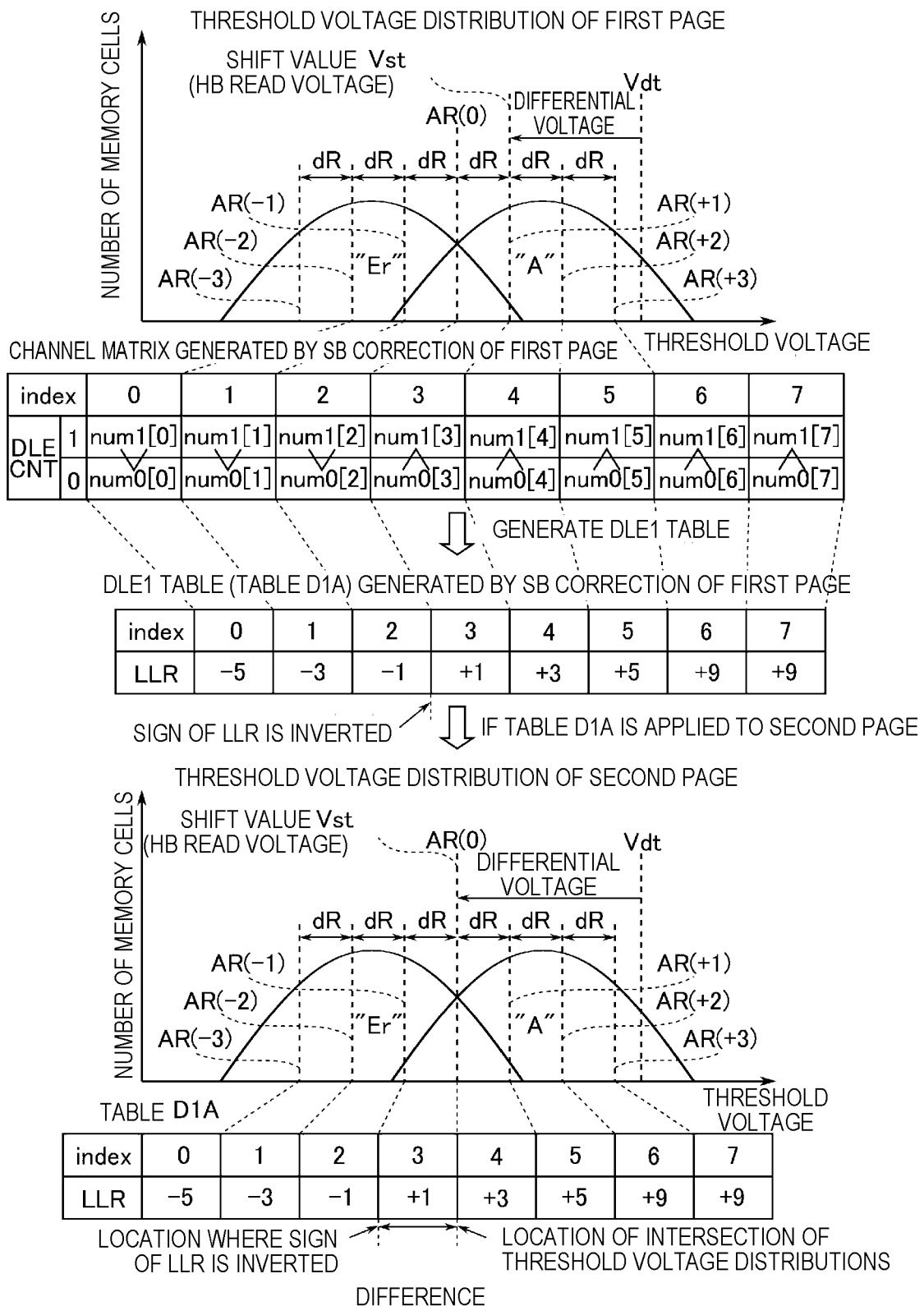

According to the first embodiment, the data error correction capability of the memory system 1 can be enhanced. The effect will be described below with reference to FIGS. 13A and 13B. FIGS. 13A and 13B are diagrams illustrating the effect of the memory system 1 according to the embodiment.

In the memory system 1, two threshold voltage distributions (hereinafter, also referred to as "threshold voltage distributions of a second page") of the memory cells MC of the next page (hereinafter, also referred to as a "second page") in the same block as two threshold voltage distributions (hereinafter, also referred to as "threshold voltage distributions of a first page") of the memory cells MC of any page (hereinafter, also referred to as a "first page") tend to have a similar distribution. This is, for example, a case where the first page and the second page are connected to the same word line and disposed in contiguous string units SU, respectively. In the examples of FIGS. 13A and 13B, the threshold voltage distribution of the first page and the threshold voltage distribution of the second page are illustrated.

FIG. 13A illustrates an example of a threshold voltage distribution of the first page where the intersection of the distributions is positioned around the voltage AR(0). It is assumed that for the first page having the threshold voltage distribution, the read operation is performed using the voltage AR (+1) as the HB read voltage. When the SB correction is successful in the read operation of the first page, for example, the channel matrix illustrated in FIG. 13A is generated using the data of which SB correction is successful. For example, the DLE1 table (hereinafter, also referred to as a "table D1A") illustrated in FIG. 13A is generated using the generated channel matrix.

In the example illustrated in FIG. 13A, the magnitude of the DLECNT is flipped between indexes 2 and 3 of the channel matrix. Accordingly, as described above with reference to FIG. 10A, the sign of the LLR is inverted between indexes 2 and 3 of the table D1A. As described above with reference to FIGS. 10B to 10E, it is estimated that the intersection (voltage) of the threshold voltage distributions of the first page is positioned at a location where the magnitude of the DLECNT of the channel matrix is flipped, i.e., a location where the sign of the LLR of the table D1A is inverted.

In the embodiment, the intersection (voltage AR(0)) of the threshold voltage distributions of the first page is acquired by the tracking. However, the HB read voltage AR(+1), which is used in the read operation of the first page and successful in the SB correction, does not match the intersection (voltage AR(0)) of the threshold voltage distributions of the first page.

As described above, it is assumed that the threshold voltage distribution of the first page and the threshold voltage distribution of the second page tend to have a similar distribution. Accordingly, it is estimated that the location of the intersection of the threshold voltage distributions of the second page is similar to that of the first page. As described above, the location of the intersection where two threshold voltage distributions overlap means a location where the number of error bits is relatively small. As a result, the read operation is performed by setting the voltage of the intersection of the threshold voltage distributions of the first page (i.e., voltage AR(0)) as the HB read voltage for the second page, thereby decreasing a possibility that the SB correction of the second page is unsuccessful.

For this purpose, in the embodiment, a result of adding or subtracting the differential voltage between the voltage AR(0) acquired by the tracking and the default voltage Vdt is generated as the shift value Vst. The read operation of the second page is performed by setting the shift value Vst (voltage AR(0)) as the HB read voltage.

However, as illustrated in FIG. 13A, there is a difference between the location of the intersection of the threshold voltage distributions of the second page and the location where the sign of the LLR of the table D1A is inverted. In this case, when the LLRs of the table D1A are applied to the data read from the second page using the HB read voltage AR(0), the possibility that the SB correction of the second page is unsuccessful increases. Meanwhile, if the location where the sign of the LLR is inverted is between indexes 3 and 4, the difference between the location of the intersection of the threshold voltage distributions of the second page and the location where the sign of the LLR of the table D1A is inverted is resolved. In this case, the possibility that the SB correction of the second page is unsuccessful decreases.

Therefore, in the embodiment, as illustrated in FIG. 13B, the table D1A is corrected based on a voltage difference between the HB read voltage (AR(+1)) of which SB correction is successful in the read operation of the first page and the voltage (voltage AR(0)) of the intersection of the threshold voltage distributions of the first page. The LLRs of the table D1A are shifted based on the voltage difference, and as a result, the table D1A is corrected to the DLE1 table (hereinafter, also referred to as a "table D1B") illustrated in FIG. 13B. As a result, the location where the sign of the LLR of the table D1B is inverted is between indexes 3 and 4. That is, the difference between the location of the intersection of the threshold voltage distributions of the second page and the location where the sign of the LLR of the table D1B is inverted is resolved. As a result, when the LLRs of the table D1B are applied to the data read from the second page using the HB read voltage AR(0), the possibility that the SB correction of the second page is successful increases. Accordingly, the error correction capability of the data can be enhanced.

[2] Second Embodiment

A second embodiment will be described. A memory system 1 according to the second embodiment is different from the memory system 1 according to the first embodiment in terms of the configuration of the memory controller 10, the configuration of the ECC circuit 14, and the DLE1 table correction processing by the read information generation circuit 17. Hereinafter, differences from the first embodiment will be primarily described.

[2-1] Configuration of Memory Controller 10

Figure 14:
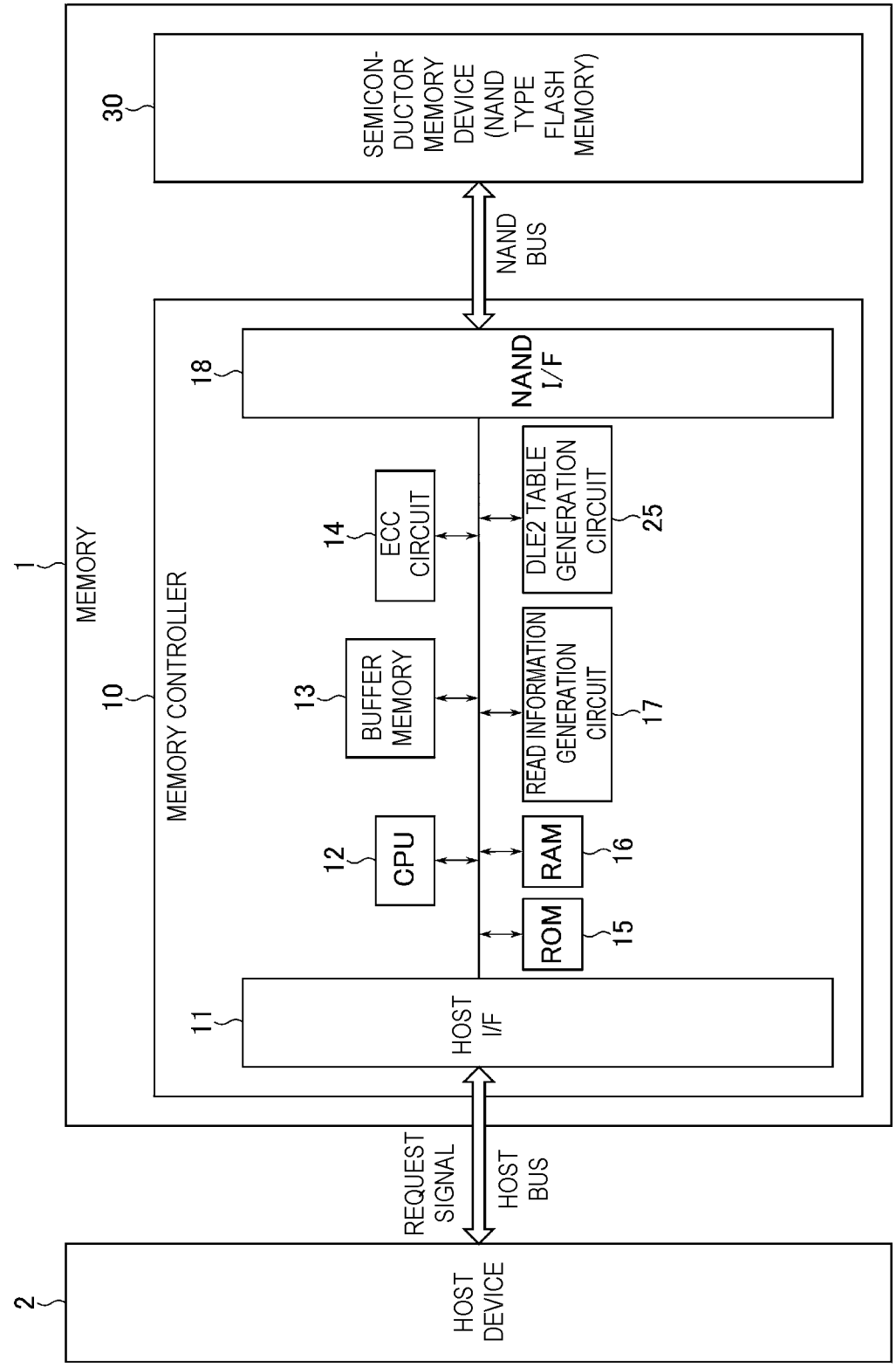
FIG. 14 is a block diagram illustrating an example of an information processing system including a memory system according to a second embodiment.

An internal configuration of the memory controller 10 will be described with reference to FIG. 14. FIG. 14 is a block diagram illustrating an example of an information processing system including the memory system 1 according to the second embodiment.

The memory controller 10 further includes a dynamic LLR estimation 2 (DLE2) table generation circuit 25.

The DLE2 table generation circuit 25 is a circuit that performs generation processing of a DLE2 table. The DLE2 table is a table representing a relationship between voltage ranges of threshold voltages of a plurality of memory cells MC and the LLR, and is generated based on data of which correction is unsuccessful in the soft-decision decoding circuit 21. Details of the processing of the DLE2 table generation circuit 25 will be described later.

The other configurations in the memory controller 10 are the same as those of the first embodiment described with reference to FIG. 1. The other configurations in the memory system 1 are the same as those of the first embodiment described with reference to FIG. 1.

[2-2] Configuration of ECC Circuit 14

Figure 15:
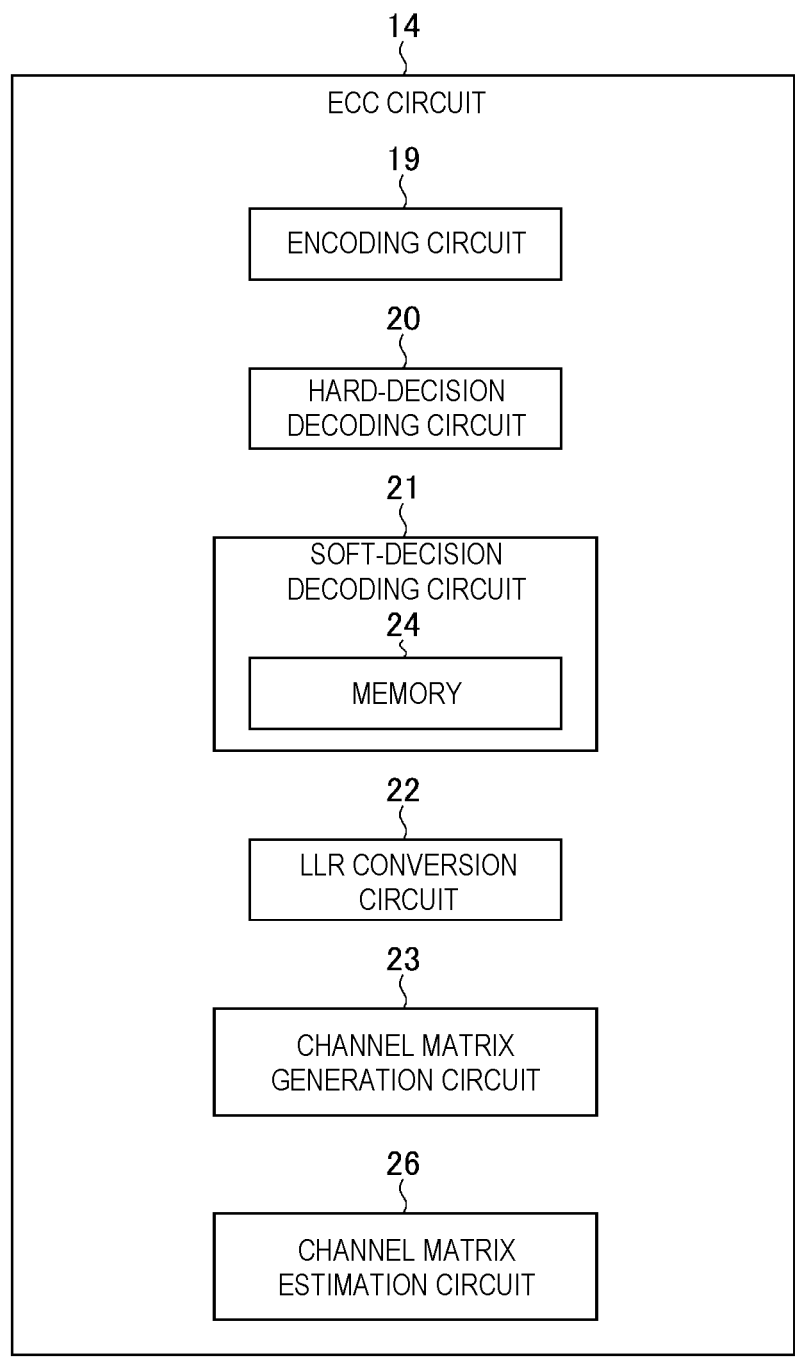
FIG. 15 is a block diagram illustrating an example of a configuration of an ECC circuit in a memory controller provided in the memory system according to the second embodiment.

An internal configuration of the ECC circuit 14 will be described with reference to FIG. 15. FIG. 15 is a block diagram illustrating an example of a configuration of an ECC circuit.

The ECC circuit 14 further includes a channel matrix estimation circuit 26.

The channel matrix estimation circuit 26 is a circuit that performs estimation processing of the channel matrix. The channel matrix estimation circuit 26 estimates the channel matrix per ECC frame using the combination of the hard bit and the soft bit, and data of which correction is unsuccessful in the soft-decision decoding circuit 21. Hereinafter, the data of which correction is unsuccessful in the soft-decision decoding circuit 21 is also referred to as "unsuccessful data".

The memory 24 stores the DLE2 table generated by the DLE2 table generation circuit 25.

The other configurations in the ECC circuit 14 are the same as those of the first embodiment described with reference to FIG. 2.

[2-3] Processing of ECC Circuit 14

Figure 16:
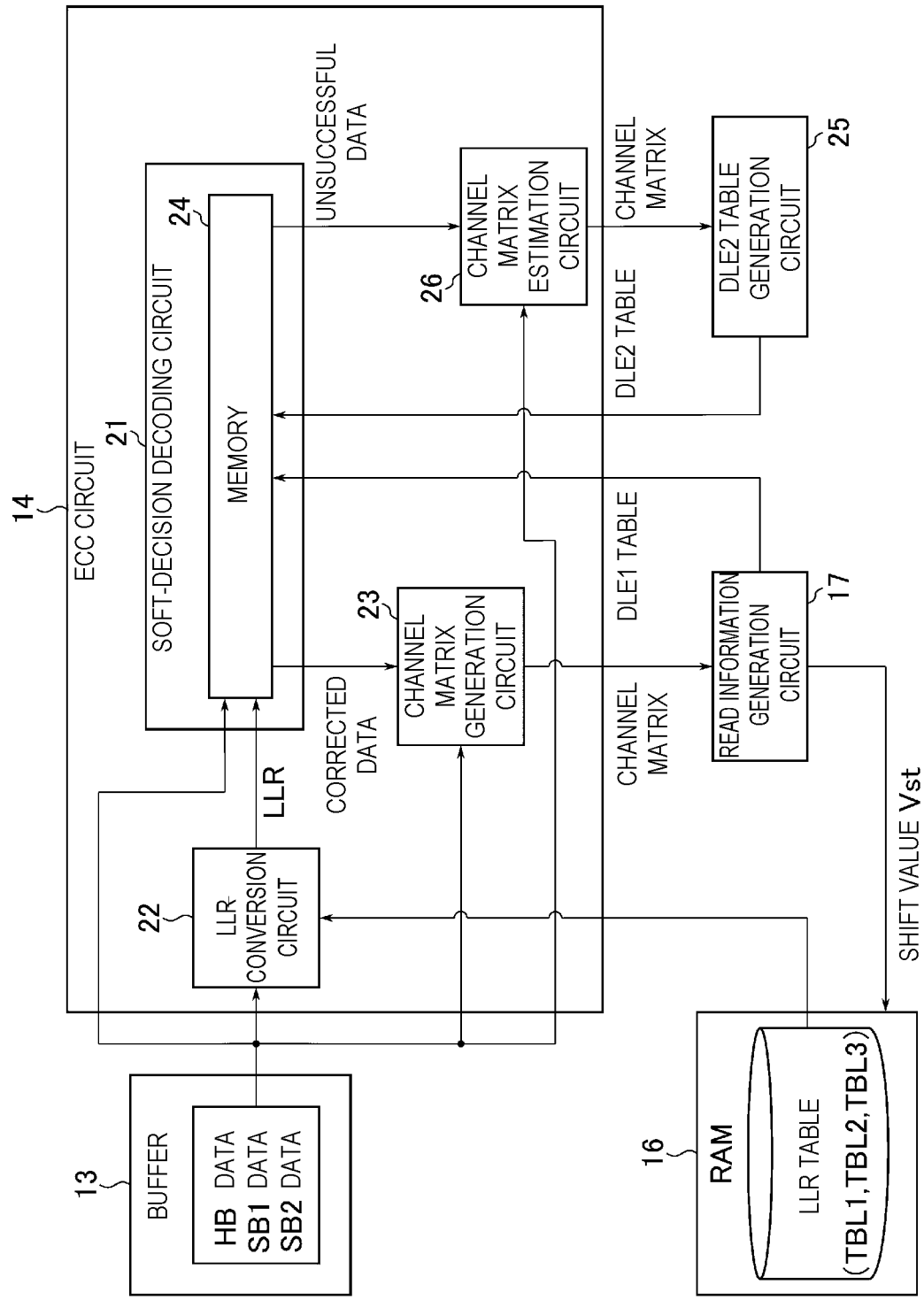
FIG. 16 is a diagram illustrating processing for soft-decision decoding according to the second embodiment.

The processing of the ECC circuit 14 will be described with reference to FIG. 16. FIG. 16 is a diagram illustrating the processing for the soft-decision decoding.

The soft-decision decoding circuit 21 stores the unsuccessful data in the memory 24 when the SB correction is unsuccessful. The soft-decision decoding circuit 21 transmits the unsuccessful data to the channel matrix estimation circuit 26.

The channel matrix estimation circuit 26 receives, from the buffer memory 13, data (HB data, SB1 data, and SB2 data) read from the NAND type flash memory 30 per ECC frame. The channel matrix estimation circuit 26 receives the unsuccessful data from the memory 24. The number of error bits included in the unsuccessful data may be different from the number of error bits included in the data received from the buffer memory 13. The channel matrix estimation circuit 26 aggregates a group of the HB data, the SB1 data, and the SB2 data received from the buffer memory 13, and the unsuccessful data received from the memory 24, and estimates the channel matrix based on an aggregation result. The channel matrix estimation circuit 26 transmits the estimated channel matrix to the DLE2 table generation circuit 25.

The other processing of the ECC circuit 14 is the same as that of the first embodiment described with reference to FIG. 7.

[2-4] Processing of DLE2 Table Generation Circuit 25

The processing of the DLE2 table generation circuit 25 will be described with reference to FIG. 16.

The DLE2 table generation circuit 25 generates the DLE2 table by statistically calculating the likelihood ratio (specifically, LLR) of the bit for each index using the estimated channel matrix. The DLE2 table generation circuit 25 calculates the DLE2 table from the estimated channel matrix. The calculation of the DLE2 table is disclosed in, for example, Japanese Patent Application (Patent Application No. 2020-899) filed on Jan. 7, 2020. The patent application is incorporated herein by reference in their entirety.

The DLE2 table generation circuit 25 transmits the DLE2 table to the memory 24. When the DLE2 table is stored in the memory 24, the DLE2 table stored in the memory 24 is overwritten with the DLE2 table received by the memory 24. The DLE2 table is used for second correction processing of the DLE1 table to be described later.

[2-5] Processing of Read Information Generation Circuit 17

The DLE1 table correction processing by the read information generation circuit 17 includes first correction processing and second correction processing.

The first correction processing and the second correction processing will be described with reference to FIG. 17. FIG. 17 is a diagram illustrating the first correction processing and the second correction processing of a DLE1 table. FIG. 17 illustrates an example of a case where the HB read voltage of which SB correction is successful is the voltage AR(0), and the intersection of two threshold voltage distributions of the memory cell MC is in the voltage AR(−1).

As illustrated in FIG. 17, the DLE2 table includes the LLRs corresponding to the voltage range corresponding to indexes 0 to 7, respectively. In FIG. 17, indexes 0 to 7 of the DLE2 table correspond to indexes 0 to 7 of the DLE1 table, respectively.

(First Correction Processing)

The read information generation circuit 17 shifts the LLR of each of indexes 0 to 5 by 1 in the right direction and calculates the integrated value and sets the integrated value as the LLR of index 7, with respect to the DLE1 table similarly to the first embodiment. As a result, the first correction processing is completed. In this step, index 0 does not include the LLR.

Note that, for example, when the intersection of two threshold voltage distributions of the memory cell MC is in the voltage AR(−2), the read information generation circuit 17 shifts the LLR of each of indexes 0 to 4 by 2 in the right direction and calculates the integrated value and sets the integrated value as the LLR of index 7, with respect to the DLE1 table similarly to the first embodiment.

(Second Correction Processing)

After the first correction processing, the LLR of index 0 of the DLE2 table is set to the LLR of index 0 of the DLE1 table corrected by the first correction processing. As a result, the second correction processing is completed.

Note that, for example, when the intersection of two threshold voltage distributions of the memory cell MC is in the voltage AR(−2), the read information generation circuit 17 sets the LLR of index 0 of the DLE2 table to the LLR of index 0 of the DLE1 table corrected by the first correction processing. The read information generation circuit 17 further sets the LLR of index 1 of the DLE2 table to the LLR of index 1 of the DLE1 table corrected by the first correction processing.

[2-6] Read Operation

Figure 18:
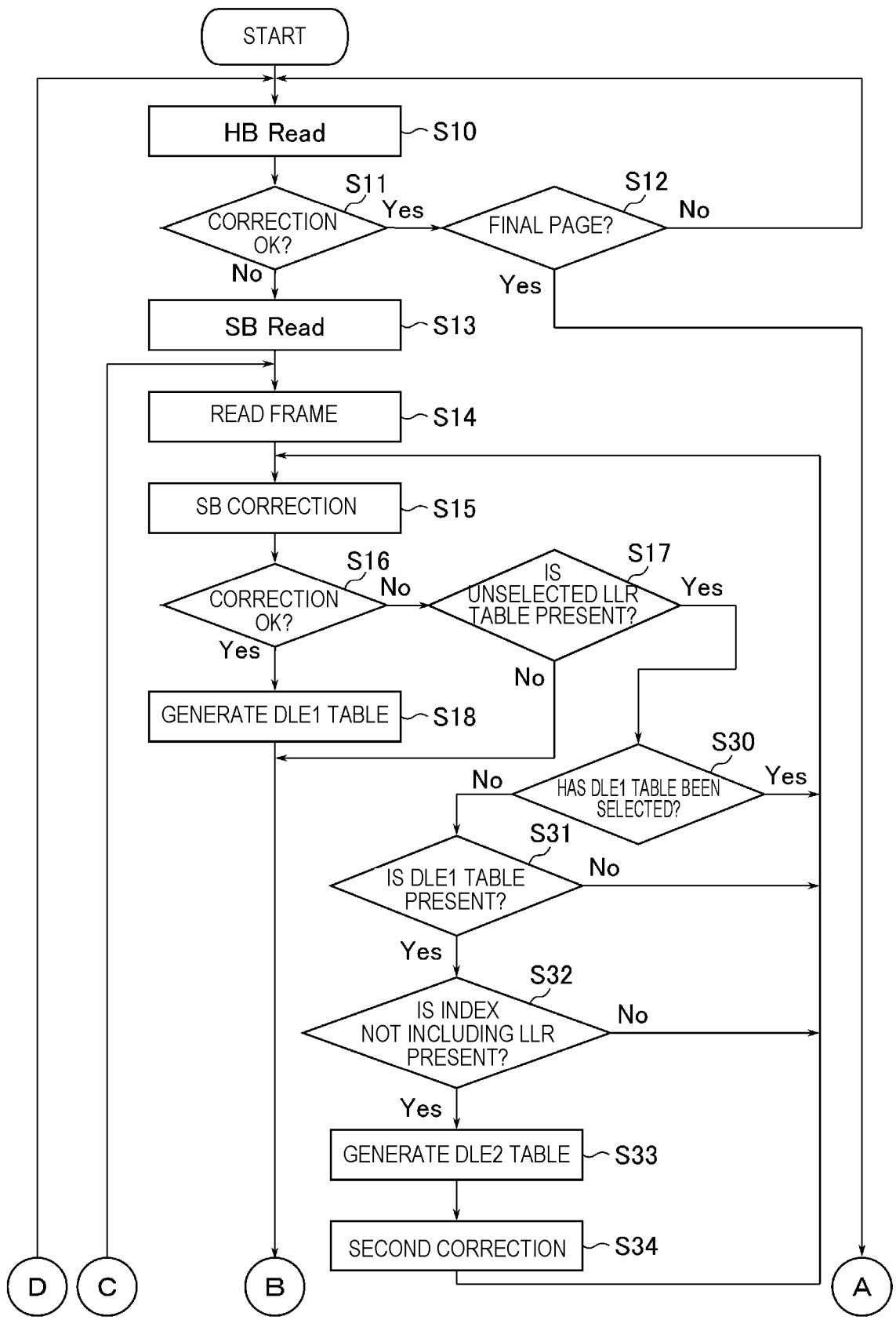
FIG. 18 is a flowchart illustrating a read operation by the memory controller provided in the memory system according to the second embodiment.
Figure 19:
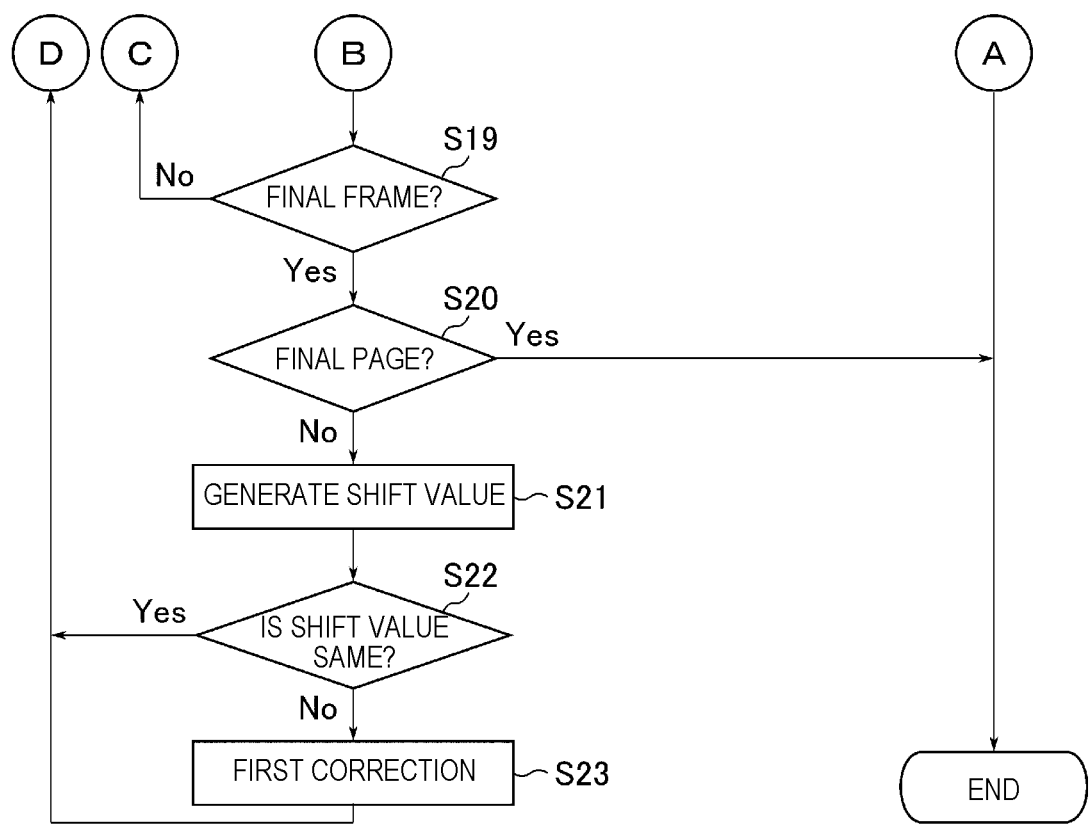
FIG. 19 is a flowchart illustrating the read operation by the memory controller provided in the memory system according to the second embodiment.

The read operation will be described with reference to FIGS. 18 and 19. FIGS. 18 and 19 are flowcharts illustrating the read operation by the memory controller 10 provided in the memory system 1 according to the second embodiment. In the second embodiment, operations of S30 to S34 are added to the operations of S10 to S23 illustrated in the FIG. 12 of the first embodiment. Further, in the second embodiment, the operation of S23 is substituted with the first correction processing. The operations of S10 to S22 are the same as those of the first embodiment. Hereinafter, the operations of S23 and S30 to S34 will be primarily described.

In FIG. 18, when the SB correction of the ECC frame is not successful (S16_No), and when there is no unselected LLR table for the same ECC frame (S17_No), the memory controller 10 executes the processing of step S19. When there is the unselected LLR table (S17_Yes), the memory controller 10 determines whether the DLE1 table has been selected as the LLR table for the same ECC frame.

When the DLE1 table has been selected for the same ECC frame (S30_Yes), the memory controller 10 executes the processing of step S15 using the next LLR table. Meanwhile, when the DLE1 table has not been selected for the same ECC frame (S30_No), the memory controller 10 determines whether the DLE1 table is in the memory 24.

When there is no DLE1 table (S31_No), the memory controller 10 executes the processing of step S15 using the next LLR table. Meanwhile, when there is the DLE1 table (S31_Yes), the memory controller 10 determines whether there is an index not including the LLR in the DLE1 table. Note that, a state in which there is the index not including the LLR in the DLE1 table is, for example, a state in which the LLR is shifted by the first correction processing and an index of a blank is present in which the LLR is not set in the DLE1 table.

When there is no index not including the LLR in the DLE1 table (S32_No), the memory controller 10 executes the processing of step S15 using the next LLR table (e.g., DLE1 table). Meanwhile, when there is the index not including the LLR in the DLE1 table (S32_Yes), the memory controller 10 (more specifically, the DLE2 table generation circuit 25) generates the DLE2 table (S33). The generated DLE2 table is stored in the memory 24. The read information generation circuit 17 performs the second correction processing of the DLE1 table (S34) using the generated DLE2 table. The DLE1 table corrected by the second correction processing is stored in the memory 24. Thereafter, the memory controller 10 executes the processing of step S15 using the next LLR table (e.g., the DLE1 table corrected by the second correction processing).

In FIG. 19, when the generated shift value Vst is not the same as the shift value stored in the RAM 16 (S22_No), the read information generation circuit 17 performs the first correction processing of the DLE1 table (S23). The DLE1 table corrected by the first correction processing is stored in the memory 24. Thereafter, the memory controller 10 executes the processing of step S10 for the next page in the same block BLK.

[2-7] Effect

With the configuration according to the second embodiment, the same effect as the first embodiment is illustrated.

Further, according to the second embodiment, the second correction processing is performed to create a DLE1 table closer to the LLR of the threshold voltage distribution of the ECC frame to be subjected to the SB correction.

[3] Third Embodiment

A third embodiment will be described. A memory system 1 according to the embodiment is different from the memory system 1 according to the first embodiment in terms of the DLE1 table correction processing performed by the read information generation circuit 17. The flowchart illustrating the read operation of the memory controller 10 is the same as that of the first embodiment. Hereinafter, differences from the first embodiment will be primarily described.

[3-1] Processing of Read Information Generation Circuit 17

(DLE1 Table Correction Processing)

The read information generation circuit 17 corrects the DLE1 table using an LLR pattern table. The LLR pattern table is a table indicating the relationship between the voltage ranges of the threshold voltages of a plurality of memory cell MCs and the LLR. The LLR pattern table is loaded to the RAM 16 from the NAND type flash memory 30, for example, immediately after power is turned on. The LLR pattern table is managed by the memory controller 10.

Figure 20:
FIG. 20 is a conceptual diagram of an LLR pattern table according to a third embodiment.

The LLR pattern table will be described with reference to FIG. 20. FIG. 20 is a conceptual diagram of the LLR pattern table.

The LLR pattern table stores the LLR for each of indexes 0 to 7. As illustrated in FIG. 20, the LLR pattern table includes the LLRs corresponding to the voltage range corresponding to indexes 0 to 7, respectively. In the example of FIG. 20, the LLR pattern tables are separately created as indexes 0 to 3 corresponding to low-voltage-side divisions D1 to D4 of the HB read voltage and indexes 4 to 7 corresponding to high-voltage-side divisions D5 to D8. The LLR pattern table for the low voltage side of the HB read voltage includes two LLR patterns Pat1 and Pat2. The LLR pattern Pat1 has the LLR corresponding to each of indexes 0 to 3. The same is also applied to the LLR pattern Pat2. The LLR pattern table for the high voltage side of the HB read voltage includes two LLR patterns Pat3 and Pat4. The LLR pattern Pat3 has the LLR corresponding to each of indexes 4 to 7. The same is also applied to the LLR pattern Pat4. Note that the value of the LLR of FIG. 20 is an example. The LLR pattern table for the low voltage side of the HB read voltage and the LLR pattern table for the high voltage side of the HB read voltage may be integrated into one table. Each LLR pattern may be experimentally obtained, for example, for each stress condition. The stress condition includes a temperature of the NAND type flash memory 30 or the number of times of the data erase operation performed for the NAND type flash memory 30. For example, the LLR pattern Pat1 has the LLR corresponding to each of indexes 0 to 3 when the NAND type flash memory 30 is at a high temperature. For example, the LLR pattern Pat2 has the LLR corresponding to each of indexes 0 to 3 when the NAND type flash memory 30 is at a low temperature.

Figure 21:
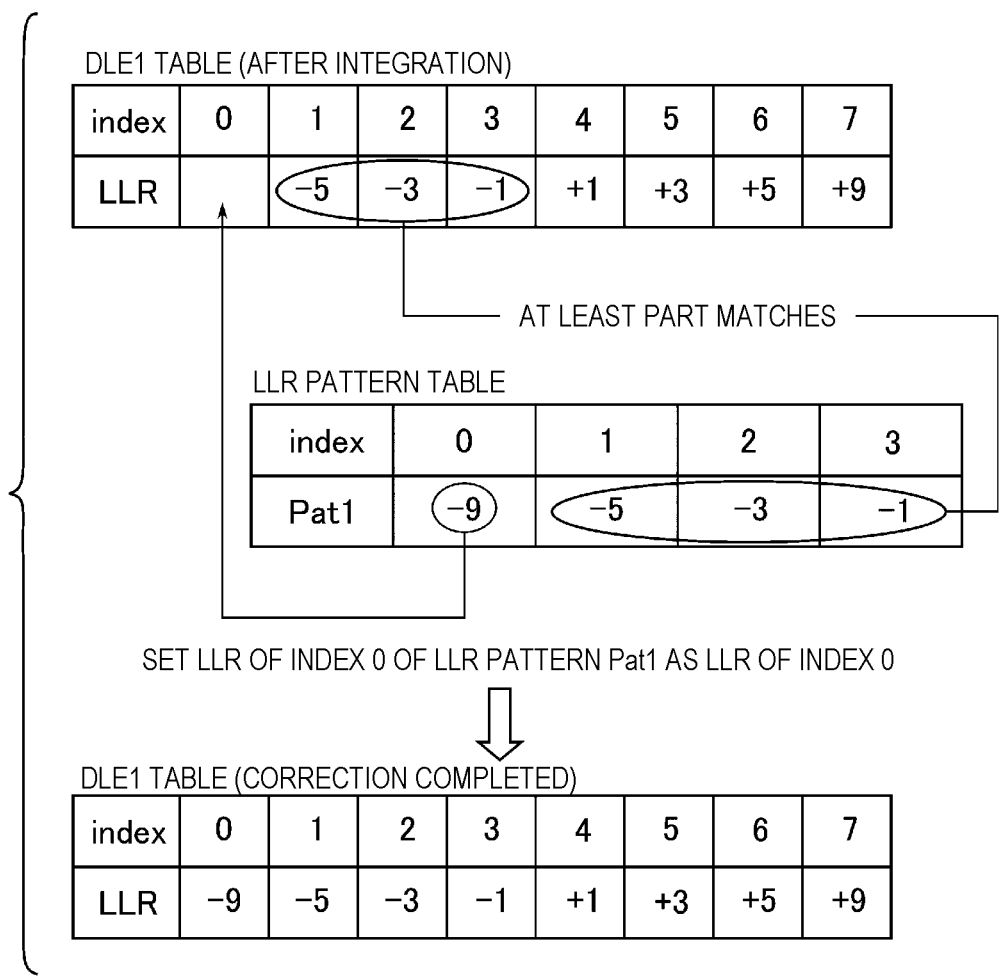
FIG. 21 is a diagram illustrating correction processing of a DLE table according to the third embodiment.

The correction processing for the DLE1 table will be described with reference to FIG. 21. FIG. 21 is a diagram illustrating the correction processing of the DLE1 table. FIG. 21 illustrates an example of a case where the HB read voltage of which SB correction is successful is the voltage AR(0), and the intersection of two threshold voltage distributions of the memory cell MC is in the voltage AR(−1).

FIG. 21, indexes 0 to 3 of the LLR pattern table correspond to indexes 0 to 3 of the DLE1 table, respectively.

The read information generation circuit 17 shifts the LLR of each of indexes 0 to 5 in the right direction by 1, and calculates the integrated value and sets the integrated value as the LLR of index 7, with respect to the DLE1 table similarly to the first embodiment. Thereafter, the read information generation circuit 17 compares a set of three LLRs (−5, −3, and −1 in the example illustrated in FIG. 21) of indexes 1 to 3 of the DLE1 table and a set of three LLRs of indexes 1 to 3 of the LLR pattern table. As a result of the comparison, the read information generation circuit 17 selects an LLR pattern in which at least a part of the LLRs matches with the LLRs of the DLE1 table. In the examples illustrated in FIGS. 20 and 21, the read information generation circuit 17 selects the LLR pattern Pat1. The read information generation circuit 17 may select an LLR pattern having, for example, a larger number of matching indexes. In the example of FIG. 21, a case where the number of matching indexes is 3 (indexes 1 to 3) is illustrated. The read information generation circuit 17 sets an LLR (=−9) of index 0 of the selected LLR pattern Pat1 as the LLR of index 0 of the DLE1 table. As a result, the correction processing of the DLE1 table is completed.

Note that, for example, if the intersection of two threshold voltage distributions of the memory cell MC is in the voltage AR(−2), the read information generation circuit 17 shifts the LLR of each of indexes 0 to 4 by 2 in the right direction and calculates the integrated value and sets the integrated value as the LLR of index 7, with respect to the DLE1 table similarly to the first embodiment. Thereafter, the read information generation circuit 17 compares a set of two LLRs of indexes 2 and 3 of the DLE1 table and a set of two LLRs of indexes 2 and 3 of the LLR pattern table. As a result of the comparison, the read information generation circuit 17 selects an LLR pattern in which at least a part of the LLRs matches with the LLRs of the DLE1 table. The read information generation circuit 17 may select an LLR pattern having, for example, a larger number of matching indexes. The read information generation circuit 17 sets the LLR of index 0 of the selected LLR pattern as the LLR of index 0 of the DLE1 table. The read information generation circuit 17 further sets the LLR of index 1 of the selected LLR pattern as the LLR of index 1 of the DLE1 table.

[3-2] Effect

With the configuration according to the third embodiment, the same effect as the first embodiment is obtained.

Further, according to the third embodiment, a DLE1 table can be created, which is closer to the LLR of the threshold voltage distribution of the ECC frame to be subjected to the SB correction.

[4] Fourth Embodiment

A fourth embodiment will be described. A memory system 1 according to the fourth embodiment is different from the memory system 1 according to the first embodiment in terms of the DLE1 table correction processing performed by the read information generation circuit 17. The flowchart illustrating the read operation of the memory controller 10 is the same as that of the first embodiment. Hereinafter, differences from the first embodiment will be primarily described.

[4-1] Processing of Read Information Generation Circuit 17

(DLE1 Table Correction Processing)

The read information generation circuit 17 corrects the DLE1 table using an LLR calculated based on a ratio of a sum of the high-voltage-side LLR of the HB read voltage and a sum of the low-voltage-side LLR of the HB read voltage.

The correction processing for the DLE1 table will be described with reference to FIG. 22. FIG. 22 is a diagram illustrating the correction processing of the DLE1 table. FIG. 22 illustrates an example in which the HB read voltage of which SB correction is successful is the voltage AR(0), and the intersection of two threshold voltage distributions of the memory cell MC is in the voltage AR(−1).

The read information generation circuit 17 shifts the LLR of each of indexes 0 to 5 by 1 in the right direction and calculates the integrated value and sets the integrated value as the LLR of index 7, with respect to the DLE1 table similarly to the first embodiment. Thereafter, the read information generation circuit 17 calculates the LLR of the index of the blank in which the LLR is not configured based on the ratio of the sum of the high-voltage-side LLR of the HB read voltage and the sum of the low-voltage-side LLR of the HB read voltage. Specifically, the LLR is calculated in the following Equation (3).

$$LLR1 = LLR8 \times \{-1 \times (LLR2 + LLR3 + LLR4)/(LLR5 + LLR6 + LLR7)\} \quad (3)$$

In the above equation, LLR1 is the LLR corresponding to index 0. Further, LLR2 to LLR8 are absolute values of the LLRs corresponding to indexes 1 to 7, respectively. The calculated LLR is saturated at, for example, an integer of which absolute value is 9 or less.

The read information generation circuit 17 sets the value (=−9) calculated in Equation (3) above as the LLR of index 0 of the DLE1 table. As a result, the correction processing of the DLE1 table is completed.

Note that, for example, if the intersection of two threshold voltage distributions of the memory cell MC is in the voltage AR(−2), the read information generation circuit 17 shifts the LLR of each of indexes 0 to 4 by 2 in the right direction and calculates the integrated value and sets the integrated value as the LLR of index 7, with respect to the DLE1 table similarly to the first embodiment. Thereafter, the read information generation circuit 17 calculates the LLR of the blank index in which the LLR is not set based on the ratio of the sum of the high-voltage-side LLR of the HB read voltage and the sum of the low-voltage-side LLR of the HB read voltage. Specifically, the LLR is calculated in the following Equation (4).

$$LLR2=LLR7\times\{-1\times(LLR3+LLR4)/(LLR5+LLR6)\} \quad (4)$$

In the above equation, LLR2 is the LLR corresponding to index 1. Further, LLR3 to LLR7 are absolute values of the LLRs corresponding to indexes 2 to 6, respectively. The calculated LLR is saturated at, for example, an integer of which absolute value is 9 or less.

The read information generation circuit 17 sets the value calculated in Equation (4) above as the LLR of index 1 of the DLE1 table. The read information generation circuit 17 sets the value calculated in Equation (3) above as the LLR of index 0 of the DLE1 table.

[4-2] Effect

With the configuration according to the fourth embodiment, the same effect as the first embodiment is obtained.

Further, according to the fourth embodiment, a DLE1 table can be created, which is closer to the LLR of the threshold voltage distribution of the ECC frame to be subjected to the SB correction.

[5] Fifth Embodiment

A fifth embodiment will be described. In the memory system 1 according to the fifth embodiment, the read operation by the memory controller 10 is different from that of the second embodiment. Hereinafter, differences from the second embodiment will be primarily described.

[5-1] Read Operation

Figure 23:
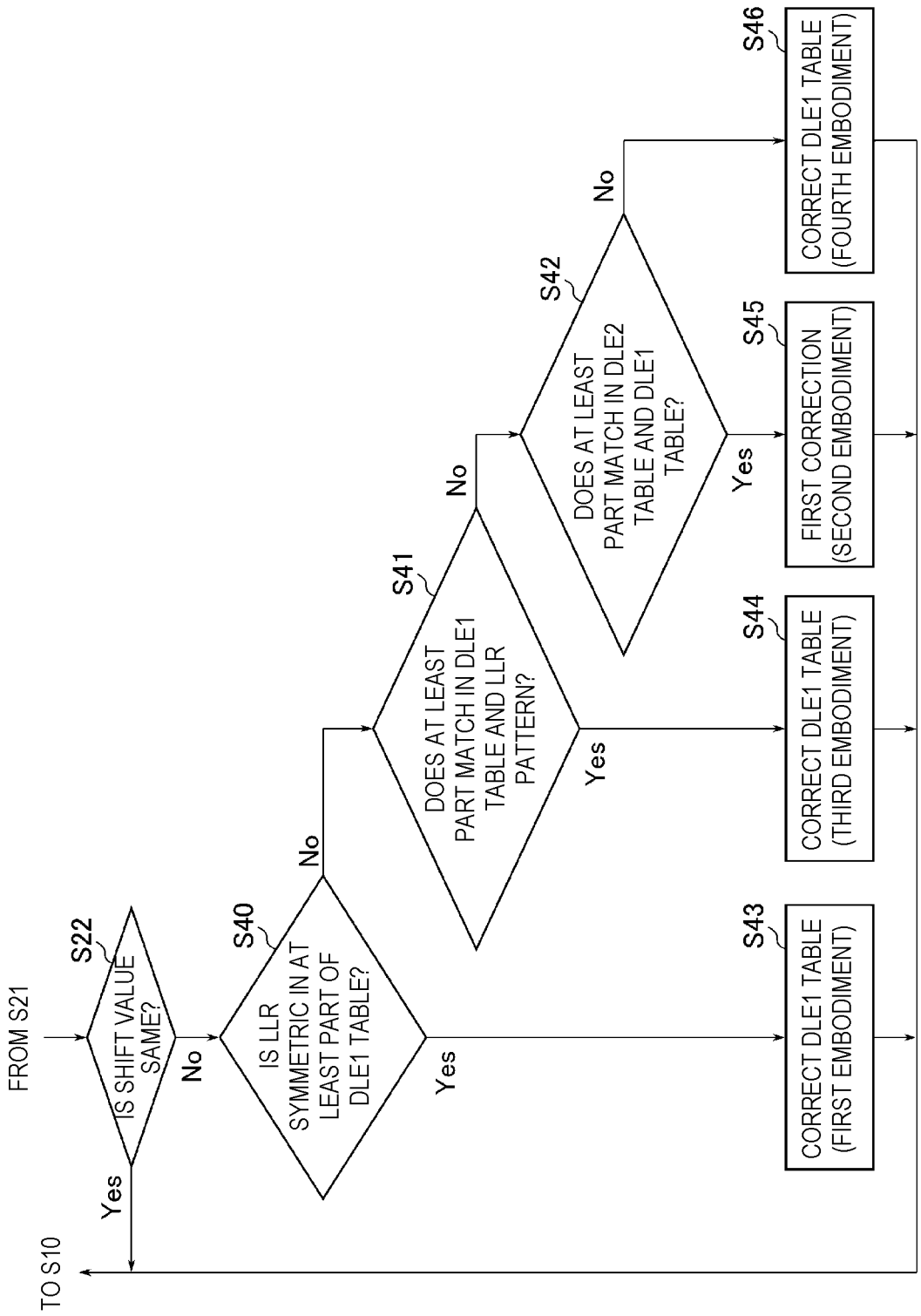
FIG. 23 is a flowchart illustrating a read operation by a memory controller provided in a memory system according to a fifth embodiment.

The read operation will be described with reference to FIG. 23. FIG. 23 is a flowchart illustrating the read operation by the memory controller 10 provided in the memory system 1 according to the fifth embodiment. In the fifth embodiment, the processing of step S23 of FIG. 19 according to the second embodiment is substituted with the processing of steps S40 to S46 of FIG. 23. The processing of steps S10 to S22 and steps S30 to S34 are the same as those of the second embodiment. Hereinafter, the operations of S40 to S46 will be primarily described.

Figure 24:
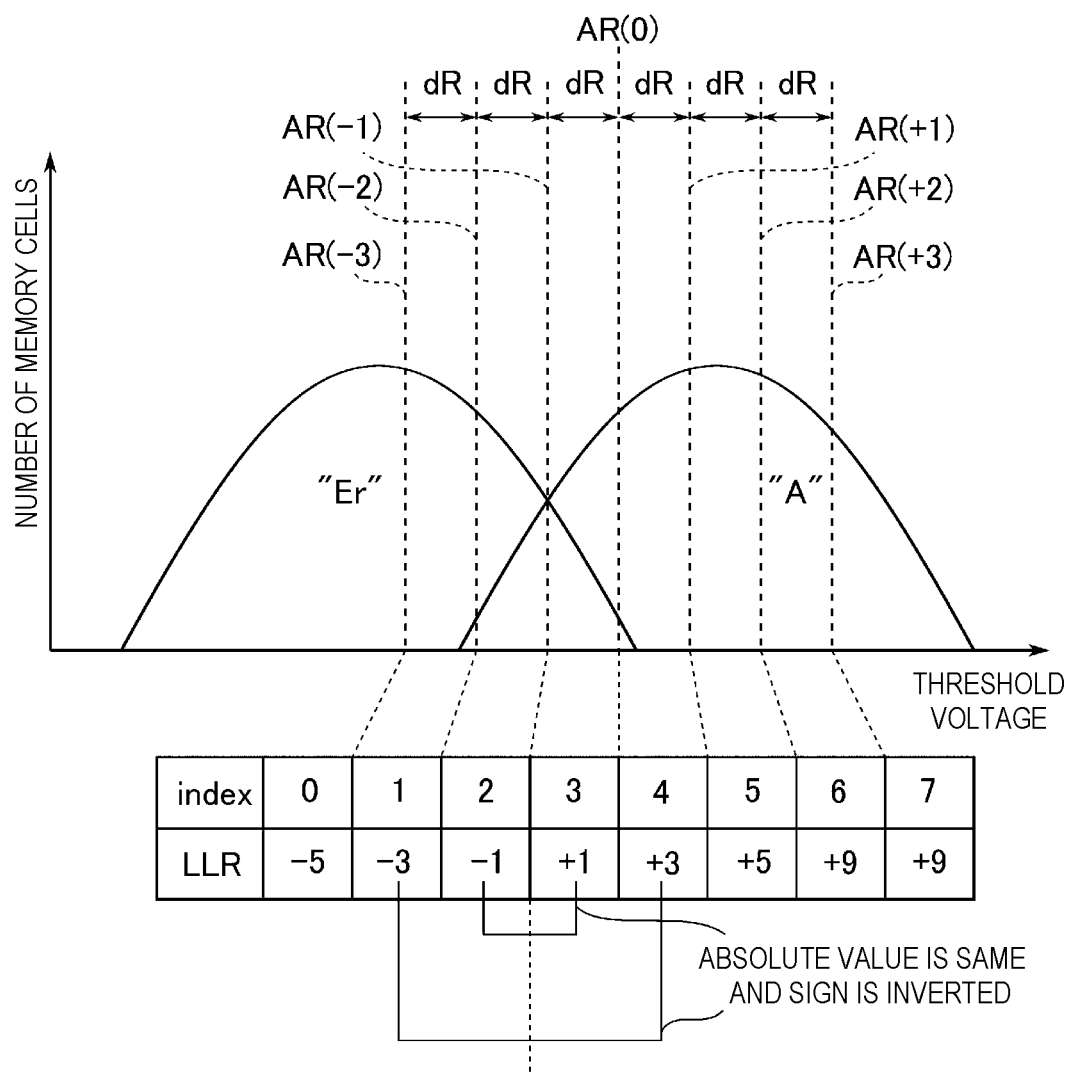
FIG. 24 is a diagram illustrating a symmetry of LLRs in a DLE table according to the fifth embodiment.

In FIG. 23, when the generated shift value Vst is not the same as the shift value stored in the RAM 16 (S22_No), and when the LLRs are symmetric in at least a part of the DLE1 table based on a location where the sign of the LLR of the DLE1 table is inverted (S40_Yes), the read information generation circuit 17 performs the correction processing of the DLE1 table according to the first embodiment (S43). FIG. 24 is a diagram illustrating a symmetry of the LLRs in the DLE1 table. In the example of FIG. 24, in indexes 2 and 3, the absolute value of the LLR is the same and the sign of the LLR is inverted. That is, the LLR of index 2 and the LLR of index 3 are symmetric. In indexes 1 and 4, the absolute value of the LLR is the same and the sign of the LLR is inverted. That is, the LLR of index 1 and the LLR of index 4 are symmetric.

Descriptions will be made while referring back to FIG. 23. When the LLRs are not symmetric in the entirety of the DLE1 table (S40_No), and when at least a part of the LLRs matches in the DLE1 table and the LLR pattern (S41_Yes), the read information generation circuit 17 performs the DLE1 table correction processing of the third embodiment (S44).

When none of the LLRs match in the DLE1 table and the LLR pattern (S41_No), and when at least a part of the LLRs matches in the DLE2 table and the DLE1 table (S42_Yes), the read information generation circuit 17 performs the first correction processing of the second embodiment (S45).

When none of the LLRs match in the DLE2 table and the DLE1 table (S42_No), the read information generation circuit 17 performs the DLE1 table correction processing of the fourth embodiment (S46).

[5-2] Effect

With the configuration according to the fifth embodiment, the same effect as the first embodiment is obtained.

Further, according to the fifth embodiment, an optimal DLE1 table according to the shape of the threshold voltage distribution can be used.

[6] Modifications

As described above, the memory system according to an embodiment includes a semiconductor memory device (30) including a plurality of memory cells (cell units (CU)) each configured to store data in a non-volatile manner according to a threshold voltage thereof and connected to a word line, and a controller (10) configured to: perform an error correction (21) based on hard bit data and soft bit data read from the plurality of memory cells; generate a first table (DLE1 table) based on data corrected by the error correction (21); determine a voltage difference between a first voltage (HB read voltage) and a second voltage (Vtr), the first voltage being a voltage applied to the word line when the data being corrected is read; and correct the first table based on the voltage difference.

Further, the embodiment is not limited to the above-described embodiments, but may be variously modified.

Further, in the flowchart described in the embodiments, the order of the processing may be changed as possible. For example, the order of the determination processing of steps S40, S41, and S42 is not limited to the order illustrated in the flowchart of FIG. 23. Further, in the flowchart of FIG. 23, steps S40 and S43 may be omitted. Steps S41 and S44 may be omitted. Steps S42 and S45 may be omitted. Step S46 may be omitted.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system comprising:
a semiconductor memory device including a plurality of memory cells each configured to store data in a non-volatile manner according to a threshold voltage thereof and connected to a word line; and
a controller configured to:
perform an error correction based on hard bit data and soft bit data read from the plurality of memory cells;
generate a first table based on data corrected by the error correction;
determine a voltage difference between a first voltage and a second voltage, the first voltage being a voltage applied to the word line when the data that has been corrected is read; and
correct the generated first table based on the voltage difference.

2. The memory system according to claim 1, wherein the controller is configured to determine the second voltage at least based on a first number of the plurality of memory cells that have threshold voltages in a first voltage range and store corrected data having a first value, and a second number of the plurality of memory cells that have threshold voltages in the first voltage range and store corrected data having a second value different from the first value.

3. The memory system according to claim 2, wherein the controller is configured to determine the second voltage further based on a third number of the plurality of memory cells that have threshold voltages in a second voltage range different from the first voltage range and store corrected data having the first value, and a fourth number of the plurality of memory cells that have threshold voltages in the second voltage range and store corrected data having the second value.

4. The memory system according to claim 3, wherein the controller is configured to determine a voltage that is between the first voltage range and the second voltage range as the second voltage, if the first number is larger than the second number and the third number is smaller than the fourth number.

5. The memory system according to claim 4, wherein the first table is configured to store a first set value corresponding to the first voltage range and a second set value corresponding to the second voltage range, and
when the first voltage is larger than the second voltage, the controller corrects the first table by storing, as the second set value of the first table after the correction, a third value that has been stored as the first set value of the first table before the correction.

6. The memory system according to claim 4, wherein the first table is configured to store a first set value corresponding to the first voltage range and a second set value corresponding to the second voltage range, and
when the first voltage is smaller than the second voltage, the controller corrects the first table by storing, as the first set value of the first table after the correction, a third value that has been stored as the second set value of the first table before the correction.

7. The memory system according to claim 1, wherein the semiconductor memory device includes a plurality of word lines and includes a block which is a unit of a data erase operation, the plurality of word lines including a first word line that is connected to the plurality of memory cells, and a second word line that is connected to another plurality of memory cells, and
the controller is configured to perform error correction for data read from said another plurality of memory cells connected to the second word line by applying the second voltage to the second word line, using the corrected first table.

8. The memory system according to claim 1, wherein the first table is a table representing a relationship between voltage ranges of the threshold voltages of the plurality of memory cells and a log likelihood ratio (LLR), the first table before the correction including at least a first LLR corresponding to a first voltage range, a second LLR corresponding to a second voltage range, and a third LLR corresponding to a third voltage range, and
the controller is configured to, in the correction of the first table, calculate an integrated value based on a first number of the plurality of memory cells that have threshold voltages in the first voltage range and store corrected data having a first value, a second number of the plurality of memory cells that have threshold voltages in the first voltage range and store corrected data having a second value different from the first value, a third number of the plurality of memory cells that have threshold voltages in the second voltage range and store corrected data having the first value, and a fourth number of the plurality of memory cells that have threshold voltages in the second voltage range and store corrected data having the second value, and in the first table after the correction, set the integrated value as an LLR corresponding to the first voltage range and the integrated value with an inverted sign as an LLR corresponding to the third voltage range.

9. The memory system according to claim 8, wherein the third voltage range includes lower threshold voltages than the first voltage range and the second voltage range, and
the first voltage range includes higher threshold voltages than the second voltage range.

10. The memory system according to claim 1, wherein the controller is configured to generate a second table based on data of which error correction is unsuccessful, each of the first table and the second table representing a relationship between voltage ranges of the threshold voltages of the plurality of memory cells and a log likelihood ratio (LLR), the first table before the correction including at least a first LLR corresponding to a first voltage range, a second LLR corresponding to a second voltage range, and a third LLR corresponding to a third voltage range, and the second table including at least a fourth LLR corresponding to the third voltage range, and
the controller is configured to, in the correction of the first table, calculate an integrated value based on a first number of the plurality of memory cells that have threshold voltages in the first voltage range and store corrected data having a first value, a second number of the plurality of memory cells that have threshold voltages in the first voltage range and store corrected data having a second value different from the first value, a third number of the plurality of memory cells that have threshold voltages in the second voltage range and store corrected data having the first value, and a fourth number of the plurality of memory cells that have threshold voltages in the second voltage range and store corrected data having the second value, and in the first table after the correction, set the integrated value as an LLR corresponding to the first voltage range, and set the fourth LLR as an LLR corresponding to the third voltage range.

11. The memory system according to claim 10, wherein
the third voltage range includes lower threshold voltages than the first voltage range and the second voltage range, and
the first voltage range includes higher threshold voltages than the second voltage range.

12. The memory system according to claim 1, wherein
the controller is configured to manage a second table, each of the first table and the second table representing a relationship between voltage ranges of the threshold voltages of the plurality of memory cells and a log likelihood ratio (LLR), the first table before the correction including at least a first LLR corresponding to a first voltage range, a second LLR corresponding to a second voltage range, a third LLR corresponding to a third voltage range, a fourth LLR corresponding to a fourth voltage range, a fifth LLR corresponding to a fifth voltage range, and a sixth LLR corresponding to a sixth voltage range, the second table including a plurality of patterns, each of the plurality of patterns including at least a seventh LLR corresponding to the third voltage range, an eighth LLR corresponding to the fourth voltage range, a ninth LLR corresponding to the fifth voltage range, and a tenth LLR corresponding to the sixth voltage range, and
the controller is configured to, in the correction of the first table:
calculate an integrated value based on a first number of the plurality of memory cells that have threshold voltages in the first voltage range and store corrected data having a first value, a second number of the plurality of memory cells that have threshold voltages in the first voltage range and store corrected data having a second value different from the first value, a third number of the plurality of memory cells that have threshold voltages in the second voltage range and store corrected data having the first value, and a fourth number of the plurality of memory cells that have threshold voltages in the second voltage range and store corrected data having the second value, and in the first table after the correction, set the integrated value as an LLR corresponding to the first voltage range;
select a pattern in which at least a part of a first set of the LLRs corresponding to the fourth to sixth voltage ranges of the first table, respectively, and a second set of the LLRs corresponding to the fourth to sixth voltage ranges of the second table, respectively, matches; and
in the first table after the correction, set the seventh LLR of the selected pattern as an LLR corresponding to the third voltage range.

13. The memory system according to claim 12, wherein
the third voltage range includes lower threshold voltages than the first voltage range, the second voltage range, the fourth voltage range, the fifth voltage range, and the sixth voltage range, and
the first voltage range includes higher threshold voltages than the second voltage range, the fourth voltage range, the fifth voltage range, and the sixth voltage range.

14. The memory system according to claim 1, wherein
the first table is a table representing a relationship between voltage ranges of the threshold voltages of the plurality of memory cells and a log likelihood ratio (LLR), the first table before the correction including at least a first LLR corresponding to a first voltage range, a second LLR corresponding to a second voltage range, a third LLR corresponding to a third voltage range, a fourth LLR corresponding to a fourth voltage range, a fifth LLR corresponding to a fifth voltage range, a sixth LLR corresponding to a sixth voltage range, a seventh LLR corresponding to a seventh voltage range, and an eighth LLR corresponding to an eighth voltage range, and
the controller is configured to, in the correction of the first table, calculate an integrated value based on a first number of the plurality of memory cells that have threshold voltages in the first voltage range and store corrected data having a first value, a second number of the plurality of memory cells that have threshold voltages in the first voltage range and store corrected data having a second value different from the first value, a third number of the plurality of memory cells that have threshold voltages in the second voltage range and store corrected data having the first value, and a fourth number of the plurality of memory cells that have threshold voltages in the second voltage range and store corrected data having the second value, and in the first table after the correction, set the integrated value as an LLR corresponding to the first voltage range, and set a value calculated based on a ratio of a sum of the fourth LLR, the fifth LLR, and the sixth LLR, and a sum of the seventh LLR, the eighth LLR, and the second LLR as an LLR corresponding to the third voltage range.

15. The memory system according to claim 14, wherein
the calculated value is obtained based on the ratio and the LLR corresponding to the first voltage range.

16. The memory system according to claim 15, wherein
the third voltage range includes lower threshold voltages than the first voltage range, the second voltage range, the fourth voltage range, the fifth voltage range, the sixth voltage range, the seventh voltage range, and the eighth voltage range, and
the first voltage range includes higher threshold voltages than the second voltage range, the fourth voltage range, the fifth voltage range, the sixth voltage range, the seventh voltage range, and the eighth voltage range.

17. A method of performing error correction on data read from a plurality of memory cells each configured to store data in a non-volatile manner according to a threshold voltage thereof, the plurality of memory cells including first memory cells connected to a first word line and second memory cells connected to a second word line, said method comprising:
performing a first error correction based on hard bit data and soft bit data read from the first memory cells;
generating a first table based on data corrected by the first error correction;
determining a voltage difference between a first voltage and a second voltage, the first voltage being a voltage applied to the first word line when the corrected data is acquired;
correcting the generated first table based on the voltage difference; and
performing a second error correction based on hard bit data and soft bit data read from the second memory cells using the corrected first table.

18. The method according to claim 17, wherein
the second voltage is determined at least based on a first number of the first memory cells that have threshold voltages in a first voltage range and store corrected data having a first value, and a second number of the first memory cells that have threshold voltages in the first voltage range and store corrected data having a second value different from the first value.

19. The method according to claim 18, wherein the second voltage is determined further based on a third number of the first memory cells that have threshold voltages in a second voltage range different from the first voltage range and store corrected data having the first value, and a fourth number of the first memory cells that have threshold voltages in the second voltage range and store corrected data having the second value.

20. The method according to claim 19, wherein a voltage that is between the first voltage range and the second voltage range is determined as the second voltage, if the first number is larger than the second number and the third number is smaller than the fourth number.

* * * * *